(12) United States Patent
Kim et al.

(10) Patent No.: US 12,424,289 B2
(45) Date of Patent: Sep. 23, 2025

(54) METHOD OF OPERATING MEMORY DEVICE AND MEMORY DEVICE PERFORMING THE SAME

(71) Applicant: Samsung Electronics Co., Ltd., Suwon-si (KR)

(72) Inventors: Chihyun Kim, Suwon-si (KR); Junehong Park, Suwon-si (KR); Jayang Yoon, Suwon-si (KR); Chiweon Yoon, Suwon-si (KR); Hyeongdo Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 96 days.

(21) Appl. No.: 18/465,541

(22) Filed: Sep. 12, 2023

(65) Prior Publication Data
US 2024/0221846 A1    Jul. 4, 2024

(30) Foreign Application Priority Data
Dec. 29, 2022 (KR) .................. 10-2022-0188874

(51) Int. Cl.
*G11C 16/10* (2006.01)
*G11C 16/26* (2006.01)
*G11C 16/30* (2006.01)
*G11C 16/34* (2006.01)

(52) U.S. Cl.
CPC .......... *G11C 16/3427* (2013.01); *G11C 16/10* (2013.01); *G11C 16/26* (2013.01); *G11C 16/30* (2013.01); *G11C 16/3459* (2013.01)

(58) Field of Classification Search
CPC ..... G11C 16/3427; G11C 16/10; G11C 16/26; G11C 16/30; G11C 16/3459; G11C 11/5628; G11C 11/5642; G11C 16/3418; G11C 16/32; G11C 16/08; G11C 16/0483; G11C 16/12; G11C 16/24; G11C 5/145
See application file for complete search history.

(56) References Cited

U.S. PATENT DOCUMENTS

| | | |
|---|---|---|
| 6,147,884 A | 11/2000 | Walia |
| 6,507,219 B2 | 1/2003 | Dabral et al. |
| 6,845,051 B2 | 1/2005 | Komura |
| 7,403,420 B2 | 7/2008 | Kim |
| 7,679,133 B2 | 3/2010 | Son et al. |
| 7,684,270 B2 | 3/2010 | Hirota et al. |

(Continued)

*Primary Examiner* — Xiaochun L Chen
(74) *Attorney, Agent, or Firm* — Harness, Dickey & Pierce, P.L.C.

(57) ABSTRACT

In a method of operating a memory device, a first operation is performed on a memory block by applying first driving voltages to a plurality of wordlines. After the first operation is completed, a first recovery operation in which the first driving voltages applied to the plurality of wordlines are discharged is performed. After the first recovery operation is completed, a second operation is performed on the memory block by applying second driving voltages to the plurality of wordlines. In the first recovery operation, first charges among a plurality of charges stored by the first driving voltages are stored in a charge recycling memory block connected to at least one charge recycling wordline. In the second operation, the second driving voltages are applied to the plurality of wordlines using the first charges stored in the charge recycling memory block.

20 Claims, 27 Drawing Sheets

(56) References Cited

U.S. PATENT DOCUMENTS

| | | |
|---|---|---|
| 8,406,062 B2 | 3/2013 | Seol et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,730,741 B2 | 5/2014 | Shibata et al. |
| 8,861,285 B2 * | 10/2014 | Choi ................ H03K 19/0175 365/189.05 |
| 2011/0233648 A1 | 9/2011 | Seol et al. |

\* cited by examiner

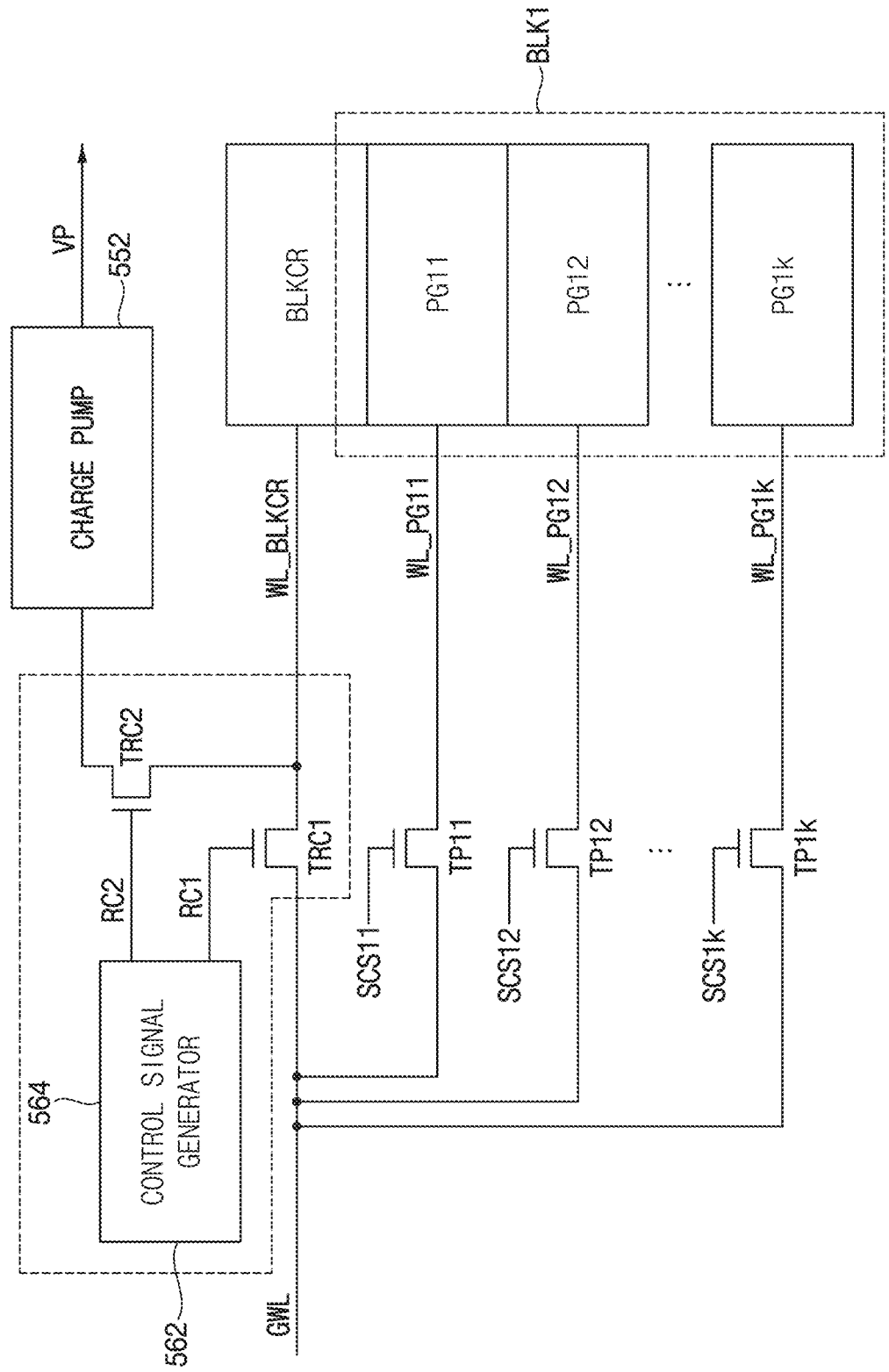

METHOD OF OPERATING MEMORY DEVICE AND MEMORY DEVICE PERFORMING THE SAME

CROSS-REFERENCE TO RELATED APPLICATION

This application claims priority under 35 USC § 119 to Korean Patent Application No. 10-2022-0188874 filed on Dec. 29, 2022 in the Korean Intellectual Property Office (KIPO), the contents of which are herein incorporated by reference in their entirety.

BACKGROUND

1. Technical Field

Example embodiments relate generally to semiconductor integrated circuits, and more particularly to methods of operating memory devices, and memory devices performing the methods.

2. Description of the Related Art

Semiconductor memory devices include volatile and nonvolatile memory devices. Volatile memory devices lose stored data when disconnected from power, and nonvolatile memory devices retain stored data when disconnected from power. Volatile memory devices may perform read and write operations at a higher speed than nonvolatile memory devices. Nonvolatile memory devices may be used to store data that needs be retained regardless of whether power is provided.

Semiconductor memory devices include memory cells connected to wordlines and bitlines, and driving voltages may be applied to the wordlines when data is written into or read from the memory cells. After the write/read operations are completed, a recovery operation may be performed on the wordlines to reduce or prevent the disturbance of the memory cells, and then a large amount of charge stored by applying the driving voltages may be discharged and discarded.

SUMMARY

At least one example embodiment of the present disclosure provides a method of operating a memory device capable of efficiently recycling charges in the memory device and enhancing the power efficiency of the memory device.

At least one example embodiment of the present disclosure provides a memory device performing the method of operating the memory device.

According to example embodiments, in a method of operating a memory device including a memory block connected to a plurality of wordlines, a first operation is performed on the memory block by applying first driving voltages to the plurality of wordlines. After the first operation is completed, a first recovery operation in which the first driving voltages applied to the plurality of wordlines are discharged is performed. After the first recovery operation is completed, a second operation is performed on the memory block by applying second driving voltages to the plurality of wordlines. In the first recovery operation, first charges among a plurality of charges stored by the first driving voltages are stored in a charge recycling memory block connected to at least one charge recycling wordline. In the second operation, the second driving voltages are applied to the plurality of wordlines using the first charges stored in the charge recycling memory block.

According to example embodiments, a memory device includes a memory cell array, a voltage generator and a control circuit. The memory cell array includes a memory block connected to a plurality of wordlines, and a charge recycling memory block connected to at least one charge recycling wordline. The voltage generator generates a plurality of driving voltages applied to the plurality of wordlines. The control circuit controls an operation of the memory cell array and an operation of the voltage generator. The control circuit performs a first operation on the memory block by applying first driving voltages to the plurality of wordlines, performs a first recovery operation in which the first driving voltages applied to the plurality of wordlines are discharged after the first operation is completed, and performs a second operation on the memory block by applying second driving voltages to the plurality of wordlines after the first recovery operation is completed. In the first recovery operation, first charges among a plurality of charges stored by the first driving voltages are stored in the charge recycling memory block. In the second operation, the second driving voltages are applied to the plurality of wordlines using the first charges stored in the charge recycling memory block.

According to example embodiments, in a method of operating a memory device including a memory block connected to a plurality of wordlines, a first operation is performed on the memory block by applying first driving voltages to the plurality of wordlines. After the first operation is completed, a first recovery operation in which the first driving voltages applied to the plurality of wordlines are discharged is performed. After the first recovery operation is completed, a second operation is performed on the memory block by applying second driving voltages to the plurality of wordlines. When performing the first recovery operation, the plurality of wordlines are electrically connected with the at least one charge recycling wordline. A first discharging operation in which voltage levels of the plurality of wordlines decrease is performed. The first discharging operation is performed by storing first charges among a plurality of charges stored by the first driving voltages in a charge recycling memory block connected to at least one charge recycling wordline. The plurality of wordlines are electrically disconnected from the at least one charge recycling wordline. A second discharging operation in which the voltage levels of the plurality of wordlines additionally decrease is performed. When performing the second operation, the plurality of wordlines are electrically connected with the at least one charge recycling wordline. A first charging operation in which voltage levels of the plurality of wordlines increase is performed. The first charging operation is performed by applying the second driving voltages to the plurality of wordlines using the first charges stored in the charge recycling memory block. The plurality of wordlines are electrically disconnected from the at least one charge recycling wordline. A charge pump is electrically connected with the at least one charge recycling wordline. A second charging operation in which the voltage levels of the plurality of wordlines additionally increase using the charge pump is performed. In the first discharging operation, the first charges move to the charge recycling memory block through the at least one charge recycling wordline by a charge sharing operation. In the first charging operation, the first charges move to the plurality of wordlines through the at least one charge recycling wordline by the charge sharing operation.

In the method of operating the memory device and the memory device according to example embodiments, the charge discharged and discarded during the recovery operation may be stored using the capacitance of the charge recycling memory block, and the charge stored in the charge recycling memory block may be transferred to the plurality of wordlines to be used in a subsequent operation. In addition, charge remaining in the charge recycling memory block after transferring to the plurality of wordlines may be additionally transferred to a charge pump to be used for driving the charge pump. Accordingly, the charge recycling operation may be more efficiently performed without a complicated control process and or a circuit that requires additional area, and the power efficiency of the memory device may be improved or enhanced.

BRIEF DESCRIPTION OF THE DRAWINGS

Illustrative, non-limiting example embodiments will be more clearly understood from the following detailed description taken in conjunction with the accompanying drawings.

FIGS. 5A and 5B are diagrams illustrating an example of a memory cell array and an example of a charge recycling control circuit included in a memory device of FIG. 2.

DETAILED DESCRIPTION OF EXAMPLE EMBODIMENTS

Figure 1:
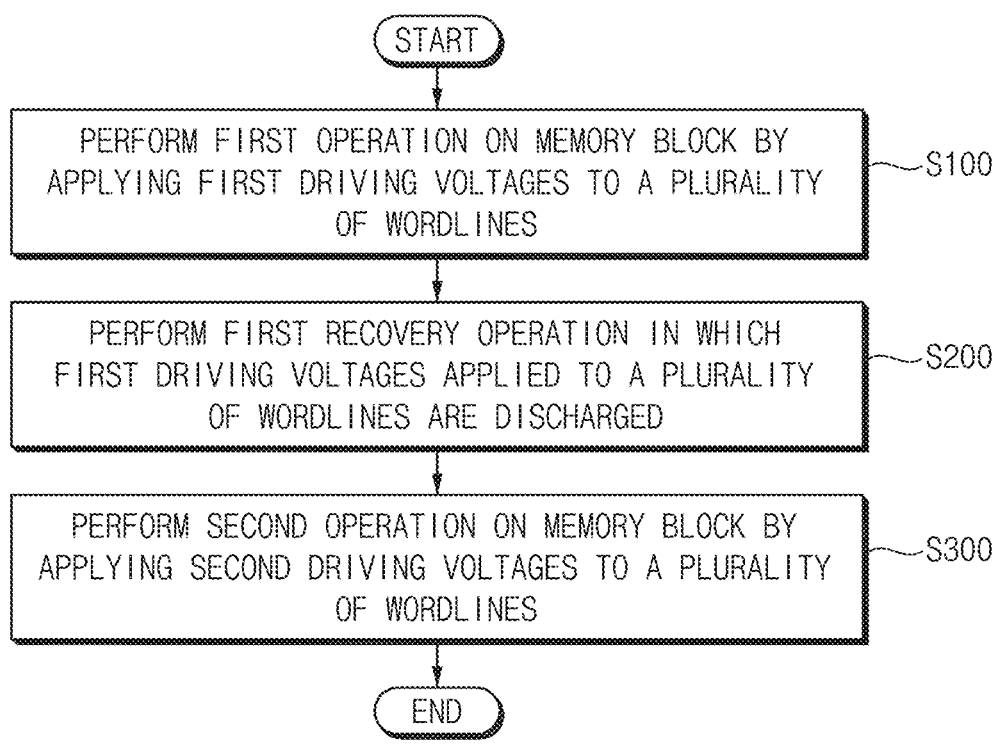
FIG. 1 is a flowchart illustrating a method of operating a memory device according to example embodiments.

Various example embodiments will be described more fully with reference to the accompanying drawings, in which example embodiments are shown. The present disclosure may, however, be embodied in many different forms and should not be construed as limited to the example embodiments set forth herein. Like reference numerals refer to like elements throughout this application.

FIG. 1 is a flowchart illustrating a method of operating a memory device according to example embodiments.

Referring to FIG. 1, a method of operating a memory device according to example embodiments is performed by a memory device that includes a memory block and a charge recycling memory block. The memory block is connected to a plurality of wordlines, and the charge recycling memory block is connected to at least one charge recycling wordline. For example, the memory device may be a nonvolatile memory device, but example embodiments are not limited thereto. A configuration of the memory device will be described in detail with reference to FIGS. 2, 3, 4, 5A and 5B. The method of operating the memory device according to example embodiments may be referred to as a method of recycling charges in a memory device.

In the method of operating the memory device according to example embodiments, a first operation is performed on the memory block by applying first driving voltages to the plurality of wordlines (operation S100). For example, the first operation may be a read operation or a program operation performed on a page included in the memory block, but example embodiments are not limited thereto.

After the first operation is successfully completed, a first recovery operation in which the first driving voltages applied to the plurality of wordlines are discharged is performed (operation S200). A plurality of charges may be stored in the plurality of wordlines by the first driving voltages applied to the plurality of wordlines while the first operation is performed. If the plurality of charges are left as they are, the disturbance may occur on the memory cells in which the read and/or program operations are completed. Therefore, the plurality of charges stored in the plurality of wordlines should be discharged. For example, in the first recovery operation, first charges, which are some or all of the plurality of charges stored by the first driving voltages in the first operation, may be transferred to and stored in the charge recycling memory block through the charge recycling wordline.

After the first recovery operation is successfully completed, a second operation is performed on the memory block by applying second driving voltages to the plurality of wordlines (operation S300). For example, the second operation may be a read operation, a program verification operation, or a program operation performed on a page included in the memory block, but example embodiments are not limited thereto. For example, in the second operation, the second driving voltages may be applied to the plurality of wordlines using the first charges stored in the charge recycling memory block in the first recovery operation.

In some example embodiments, the operation of storing the first charges in the charge recycling memory block in S200 and the operation of applying the second driving voltages using the first charges in S300 may be performed by a charge sharing operation. For example, the operation of storing the first charges in the charge recycling memory block and the operation of applying the second driving voltages using the first charges may be performed using capacitances of charge recycling memory cells included in the charge recycling memory block and a capacitance of the at least one charge recycling wordline.

In some example embodiments, to perform the efficient charge recycling operation, a ratio of a capacitance of the memory block and a capacitance of the charge recycling memory block may be set to about 1:1.

In some example embodiments, the charge recycling memory block and the charge recycling memory cells may be a dummy memory block and dummy memory cells in which data is not stored, and the at least one charge recycling wordline may be a dummy wordline.

In a memory device, wordlines may be set up by driving voltages when write/read operations are performed, and a recovery operation (e.g., a discharging operation) may be performed when the write/read operations are completed to reduce or prevent memory cells from being disturbed. Conventionally, there were problems in that a large amount of charges stored by the driving voltages are discarded during the recovery operation and the power efficiency is reduced when considering energy required to generate high driving voltages.

In the method of operating the memory device according to example embodiments, the charge discharged and discarded during the recovery operation may be stored using the capacitance of the charge recycling memory block, and the charge stored in the charge recycling memory block may be transferred to the plurality of wordlines to be used in a subsequent operation. In addition, charge remaining in the charge recycling memory block after transferring to the plurality of wordlines may be additionally transferred to a charge pump to be used for driving the charge pump. Accordingly, the charge recycling operation may be more efficiently performed without a complicated control process or a circuit that requires additional area, and the power efficiency of the memory device may be improved or enhanced.

Figure 2:
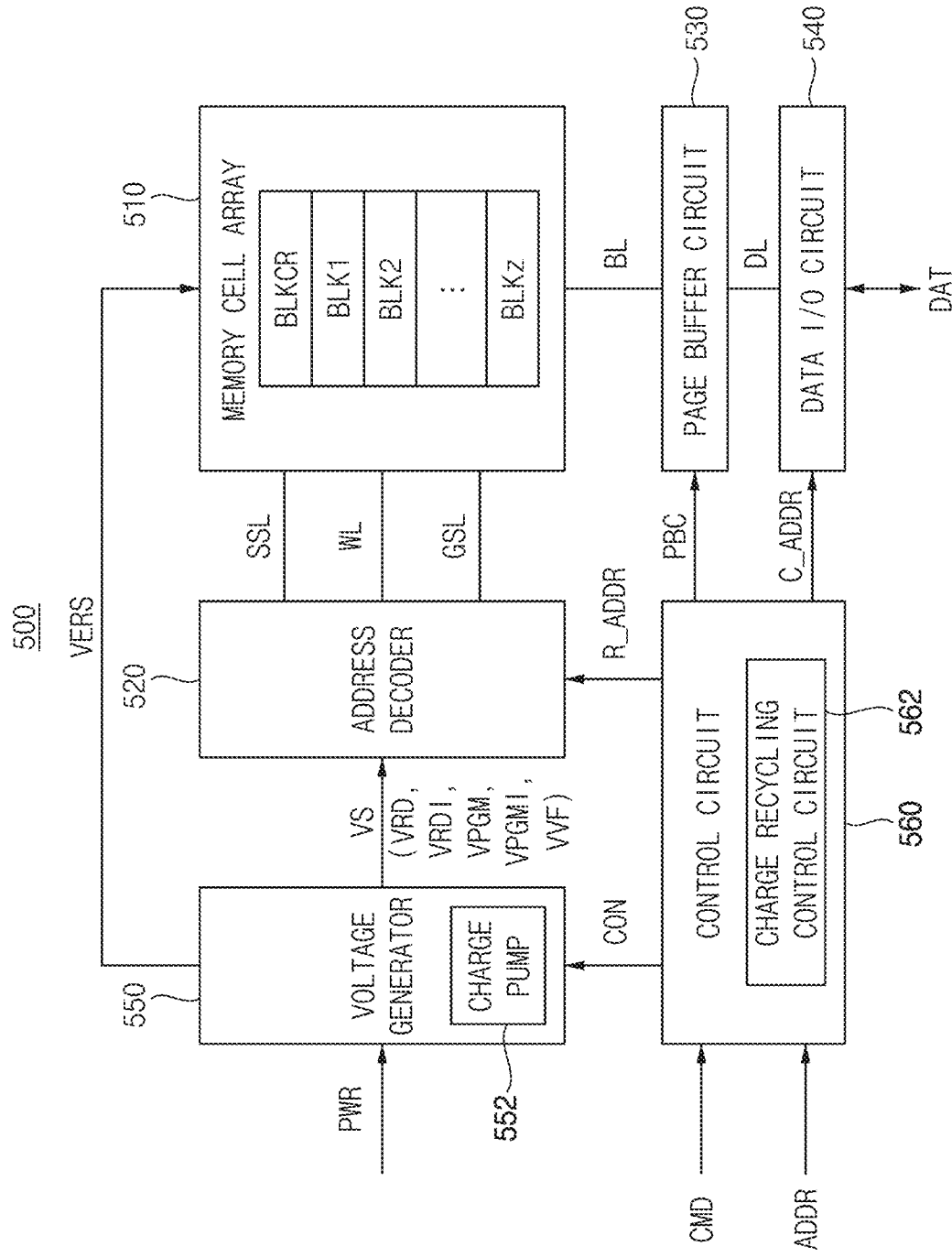
FIG. 2 is a block diagram illustrating a memory device according to example embodiments.

FIG. 2 is a block diagram illustrating a memory device according to example embodiments.

Referring to FIG. 2, a memory device 500 includes a memory cell array 510, a voltage generator 550 and a control circuit 560. The memory device 500 may further include an address decoder 520, a page buffer circuit 530 and a data input/output (I/O) circuit 540. For example, the memory device 500 may be a nonvolatile memory device, e.g., a NAND flash memory device.

The memory cell array 510 is connected to the address decoder 520 via a plurality of string selection lines SSL, a plurality of wordlines WL and a plurality of ground selection lines GSL. The memory cell array 510 is further connected to the page buffer circuit 530 via a plurality of bitlines BL. The memory cell array 510 may include a plurality of memory cells (e.g., a plurality of nonvolatile memory cells) that are connected to the plurality of wordlines WL and the plurality of bitlines BL. The memory cell array 510 may be divided into a plurality of memory blocks BLK1, BLK2, . . . , BLKz each of which includes memory cells. In addition, each of the plurality of memory blocks BLK1 to BLKz may be divided into a plurality of pages. The memory cell array 510 may further include a charge recycling memory block BLKCR, e.g., a dummy memory block. For example, the lowermost memory block having the smallest channel hole size may be set as the charge recycling memory block BLKCR.

In some example embodiments, as will be described with reference to FIGS. 3 and 4, the memory cell array 510 may be a three-dimensional (3D) memory cell array, which is formed on a substrate in a three-dimensional structure (or a vertical structure). In this example, the memory cell array 510 may include a plurality of cell strings (e.g., a plurality of vertical NAND strings) that are vertically oriented such that at least one memory cell is located over another memory cell.

The control circuit 560 receives a command CMD and an address ADDR from outside (e.g., from a memory controller 20 in FIG. 28), and controls erasure, programming and read operations of the memory device 500 based on the command CMD and the address ADDR. An erasure operation may include performing a sequence of erase loops, and a programming operation may include performing a sequence of program loops. Each program loop may include a program operation and a program verification operation. Each erase loop may include an erase operation and an erase verification operation. The read operation may include a normal read operation and a data recovery read operation.

For example, the control circuit 560 may generate control signals CON, which are used for controlling the voltage generator 550, and may generate control signals PBC for controlling the page buffer circuit 530, based on the command CMD, and may generate a row address R_ADDR and a column address C_ADDR based on the address ADDR. The control circuit 560 may provide the row address R_ADDR to the address decoder 520 and may provide the column address C_ADDR to the data I/O circuit 540.

The control circuit 560 may control the address decoder 520, the page buffer circuit 530, the data I/O circuit 540 and the voltage generator 550 such that the memory device 500 performs the method of operating the memory device according to example embodiments described with reference to FIG. 1. For example, the control circuit 560 may control the address decoder 520, the page buffer circuit 530, the data I/O circuit 540 and the voltage generator 550 to perform a first operation on one memory block by applying first driving voltages to wordlines, to perform a first recovery operation in which the first driving voltages applied to the wordlines are discharged after the first operation is completed, and to perform a second operation on the one memory block by applying second driving voltages to the wordlines after the first recovery operation is completed. Charges may be stored in the charge recycling memory block BLKCR during the first recovery operation, and the wordlines may be set up using the charges stored in the charge recycling memory block BLKCR during the second operation.

The control circuit 560 may include a charge recycling control circuit 562 for performing the method of operating the memory device according to example embodiments described with reference to FIG. 1. A configuration of the charge recycling control circuit 562 will be described in detail with reference to FIGS. 5A and 5B.

The address decoder 520 may be connected to the memory cell array 510 via the plurality of string selection lines SSL, the plurality of wordlines WL and the plurality of ground selection lines GSL. For example, in the erase/write/read operations, the address decoder 520 may determine at least one of the plurality of wordlines WL as a selected wordline, may determine at least one of the plurality of string selection lines SSL as a selected string selection line, and may determine at least one of the plurality of ground selection lines GSL as a selected ground selection line, based on the row address R_ADDR.

The voltage generator 550 may generate driving voltages VS that are required for an operation of the memory device 500 based on a power PWR and the control signals CON. The driving voltages VS may be applied to the plurality of string selection lines SSL, the plurality of wordlines WL and the plurality of ground selection lines GSL via the address decoder 520. For example, the driving voltages VS may include a read voltage VRD and a read inhibit (or pass) voltage VRDI that are required for the read operation, a program voltage VPGM, a program inhibit (or pass) voltage VPGMI and a program verification voltage VVF that are required for the program loop, etc. In addition, the voltage generator 550 may generate an erase voltage VERS that is required for the erase operation based on the power PWR and the control signals CON. The erase voltage VERS may be applied to the memory cell array 510 directly or via the bitline BL. For example, the voltage generator 550 may include a charge pump 552 used to generate the driving voltages VS.

For example, during the read operation, the voltage generator 550 may apply the read voltage VRD to the selected wordline and may apply the read inhibit voltage VRDI to unselected wordlines via the address decoder 520. For example, during the program operation, the voltage generator 550 may apply the program voltage VPGM to the selected wordline and may apply the program inhibit voltage VPGMI to the unselected wordlines via the address decoder 520. In addition, during the program verification operation, the voltage generator 550 may apply the program verification voltage VVF to the selected wordline and may apply a verification inhibit (or pass) voltage to the unselected wordlines via the address decoder 520.

The page buffer circuit 530 may be connected to the memory cell array 510 via the plurality of bitlines BL. The page buffer circuit 530 may include a plurality of page buffers. The page buffer circuit 530 may store data DAT to be programmed into the memory cell array 510 or may read data DAT sensed from the memory cell array 510. In other words, the page buffer circuit 530 may operate as a write driver or a sensing amplifier according to an operation mode of the memory device 500.

The data I/O circuit 540 may be connected to the page buffer circuit 530 via data lines DL. The data I/O circuit 540 may provide the data DAT from outside of the memory device 500 (e.g., from the memory controller 20 in FIG. 28) to the memory cell array 510 via the page buffer circuit 530 or may provide the data DAT from the memory cell array 510 to the outside of the memory device 500 (e.g., to the memory controller 20 in FIG. 28), based on the column address C_ADDR.

Figure 3:
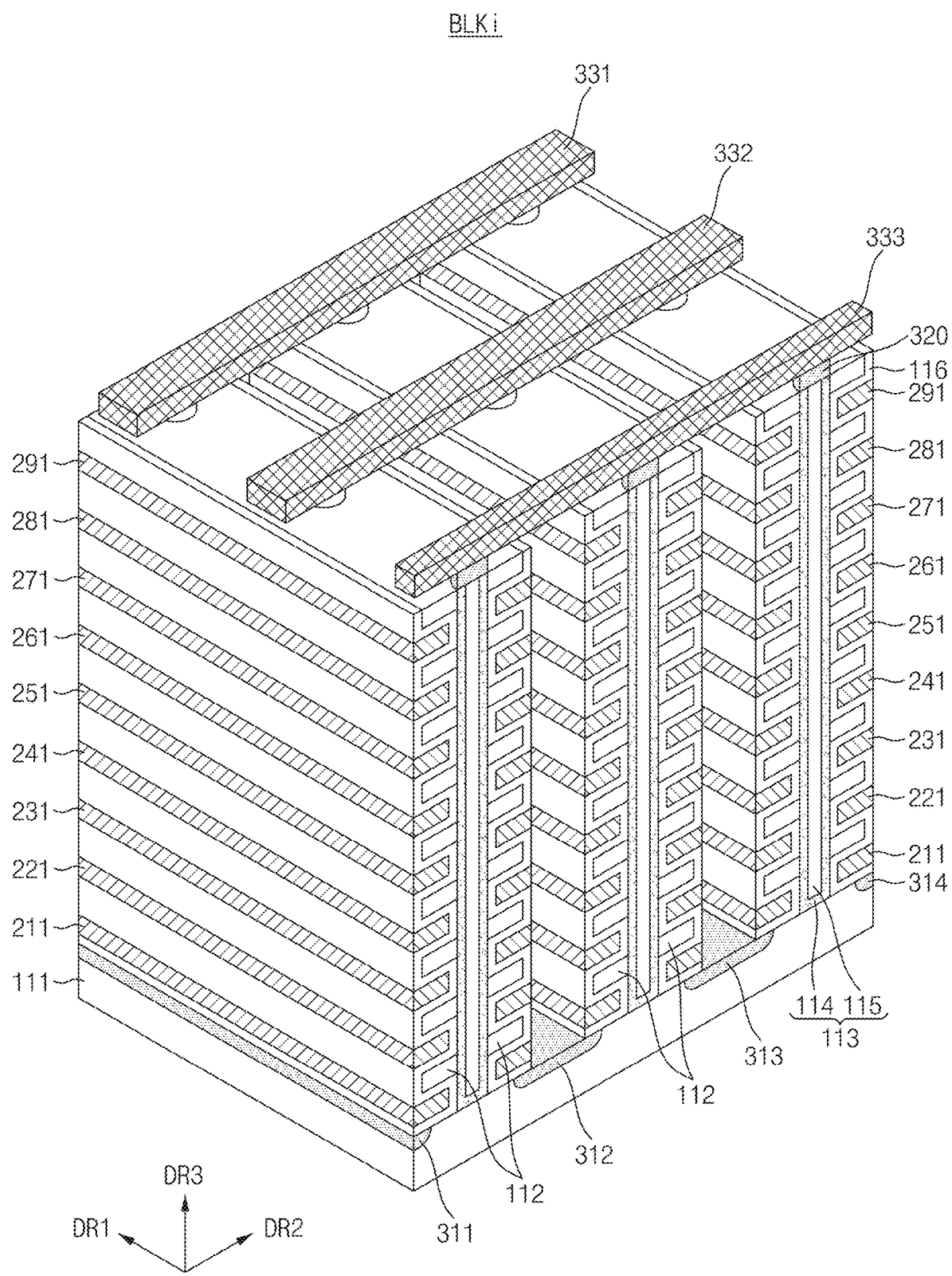
FIG. 3 is a perspective view of an example of a memory block included in a memory cell array in a memory device of FIG. 2.

FIG. 3 is a perspective view of an example of a memory block included in a memory cell array in a memory device of FIG. 2.

Referring to FIG. 3, a memory block BLKi includes a plurality of cell strings (e.g., a plurality of vertical NAND strings) which are formed on a substrate in a three-dimensional structure (or a vertical structure). The memory block BLKi includes structures extending along first, second and third directions DR1, DR2 and DR3. Two directions substantially parallel to a first surface (e.g., a top surface) of a substrate 111 and crossing each other are referred to as the first direction DR1 (e.g., a X-axis direction) and the second direction DR2 (e.g., a Y-axis direction). In addition, a direction substantially vertical to the first surface of the substrate 111 is referred to as the third direction DR3 (e.g., a Z-axis direction). For example, the first and second directions DR1 and DR2 may be substantially perpendicular to each other. In addition, the third direction DR3 may be substantially perpendicular to both the first and second directions DR1 and DR2.

The substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. In some example embodiments, the substrate 111 has a p-type well (or a p-type pocket well). However, the conductive type of the substrate 111 is not limited to p-type.

A plurality of doping regions 311, 312, 313 and 314 arranged along the second direction DR2 are provided in/on the substrate 111. These plurality of doping regions 311 to 314 may have a second type of charge carrier impurity (e.g., a second conductivity type) different from the first type of the substrate 111. In some example embodiments, the first to fourth doping regions 311 to 314 may be an n-type. However, the conductive type of the first to fourth doping regions 311 to 314 is not limited to n-type.

A plurality of insulation materials 112 extending along the first direction DR1 are sequentially provided along the third direction DR3 on a region of the substrate 111 between the first and second doping regions 311 and 312. For example, the plurality of insulation materials 112 are provided along the third direction DR3, being spaced by a specific distance. For example, the insulation materials 112 may include an insulation material such as an oxide layer.

A plurality of pillars 113 penetrating the insulation materials along the third direction DR3 are sequentially disposed along the first direction DR1 on a region of the substrate 111 between the first and second doping regions 311 and 312. For example, the plurality of pillars 113 may penetrate the insulation materials 112 to contact the substrate 111.

In some example embodiments, each pillar 113 includes a plurality of materials. For example, a channel layer 114 of each pillar 113 may include a silicon material having a first conductivity type. For example, the channel layer 114 of each pillar 113 may include a silicon material having the same conductivity type as the substrate 111. In some example embodiments, the channel layer 114 of each pillar 113 includes p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In an example, the internal material 115 of each pillar 113 includes an air gap. The term 'air' as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 need not be provided between the first conductive materials 211 to 291 corresponding to ground selection lines GSL (e.g., 211) and string selection lines SSL (e.g., 291). In this example, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the first direction DR1 is provided between the insulation material 112 adjacent to the substrate 111 and the substrate 111. In more detail, the first conductive material 211 extending along the first direction DR1 is provided between the insulation layer 116 at the bottom of the insulation material 112 adjacent to the substrate 111 and the substrate 111.

A first conductive material extending along the first direction DR1 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction DR1 are provided between the insulation materials 112 and it may be understood that the insulation layer 116 is provided between the insulation materials 112 and the first conductive materials 221 to 281. The first conductive materials 211 to 291 may be formed of a conductive metal, but the first conductive materials 211 to 291 may include a conductive material such as a polysilicon in other example embodiments.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction DR1. A plurality of pillars 113 are provided that are disposed sequentially along the first direction DR1 and penetrate the plurality of insulation materials 112 along the third direction DR3. An insulation layer 116 is provided on the exposed surfaces of the plurality of insulation materials 112 and the plurality of pillars 113, and a plurality of first conductive materials 211 to 291 extend along the first direction DR1. Similarly, the same structures as those on the first and second doping regions 311 and 312 may be provided in a region between the third and fourth doping regions 313 and 314.

A plurality of drain regions 320 are provided on the plurality of pillars 113, respectively. The drain regions 320 may include silicon materials doped with a second type of charge carrier impurity. For example, the drain regions 320 may include silicon materials doped with an n-type dopant. In some example embodiments, the drain regions 320 include n-type silicon materials. However, the drain regions 320 are not limited to n-type silicon materials.

On the drain regions, a plurality of second conductive materials 331, 332 and 333 are provided, which extend along the second direction DR2. The second conductive materials 331 to 333 are disposed along the first direction DR1, being spaced apart from each other by a specific distance. The second conductive materials 331 to 333 are respectively connected to the drain regions 320 in a corresponding region. The drain regions 320 and the second conductive material 333 extending along the second direction DR2 may be connected through each contact plug. Each contact plug may be, for example, a conductive plug formed of a conductive material such as a metal. The second conductive materials 331 to 333 may include metal materials. The second conductive materials 331 to 333 may include conductive materials such as a polysilicon.

In the example of FIG. 3, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be variously determined according to process and control techniques.

Figure 4:
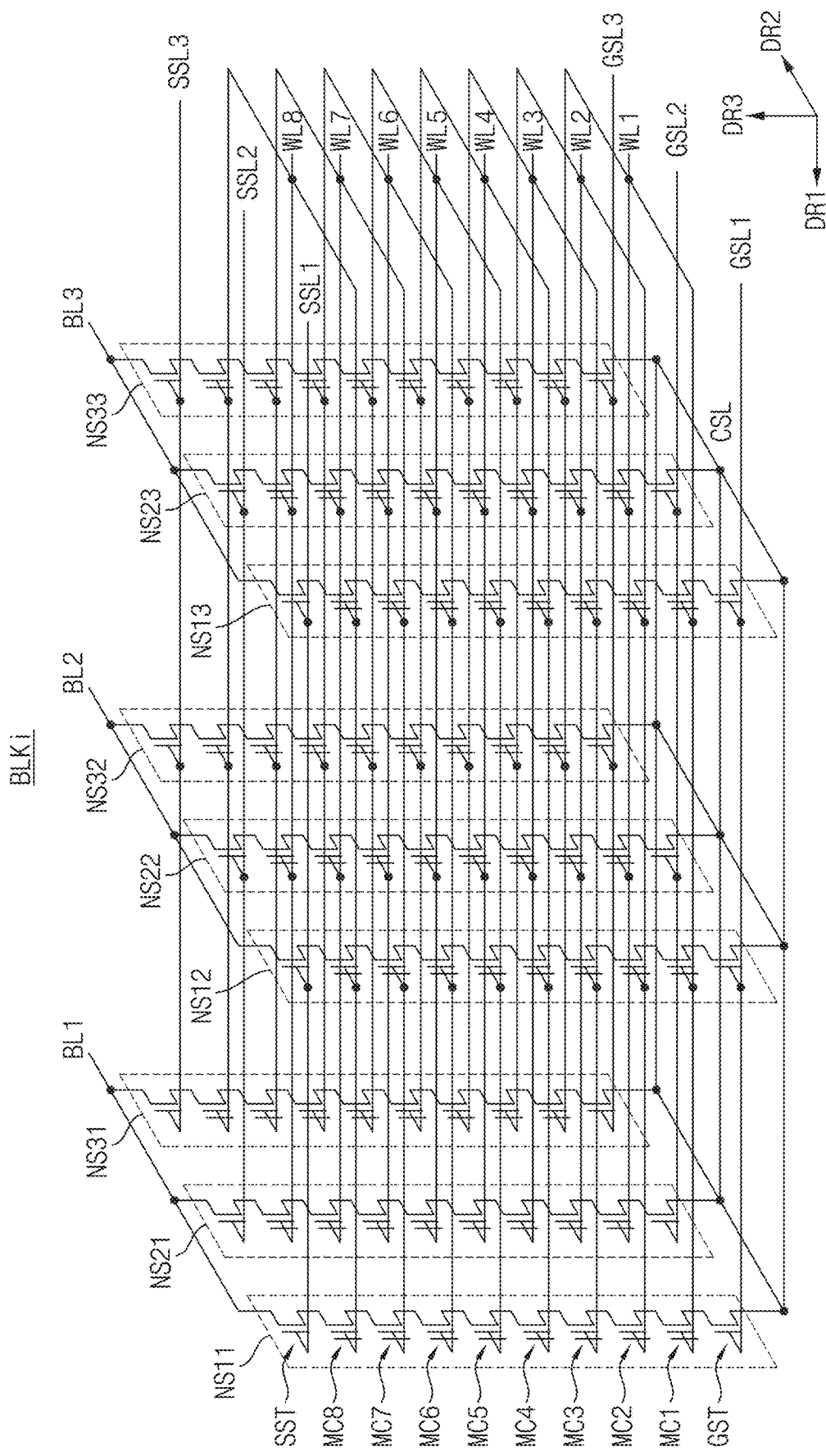
FIG. 4 is a circuit diagram illustrating an equivalent circuit of a memory block described with reference to FIG. 3.

FIG. 4 is a circuit diagram illustrating an equivalent circuit of a memory block described with reference to FIG. 3.

A memory block BLKi of FIG. 4 may be formed on a substrate in a three-dimensional structure (or a vertical structure). For example, a plurality of cell strings included in the memory block BLKi may be formed in a direction perpendicular to the substrate.

Referring to FIG. 4, the memory block BLKi may include a plurality of cell strings NS11, NS12, NS13, NS21, NS22, NS23, NS31, NS32 and NS33 connected between bitlines BL1, BL2 and BL3 and a common source line CSL. Each of the cell strings NS11 to NS33 may include a string selection transistor SST, a plurality of memory cells MC1, MC2, MC3, MC4, MC5, MC6, MC7 and MC8, and a ground selection transistor GST. For example, the bitlines BL1 to BL3 may correspond to the second conductive materials 331 to 333 in FIG. 3, and the common source line CSL may be formed by interconnecting the first to fourth doping regions 311 to 314 in FIG. 3.

Each string selection transistor SST may be connected to a corresponding string selection line (one of SSL1, SSL2 and SSL3). The plurality of memory cells MC1 to MC8 may be connected to corresponding wordlines WL1, WL2, WL3, WL4, WL5, WL6, WL7 and WL8, respectively. Each ground selection transistor GST may be connected to a corresponding ground selection line (one of GSL1, GSL2 and GSL3). Each string selection transistor SST may be connected to a corresponding bitline (e.g., one of BL1 to BL3), and each ground selection transistor GST may be connected to the common source line CSL. In the example of FIG. 4, some of the string selection transistors SST are connected to the same bitline (e.g., one of BL1 to BL3) to connect corresponding cell strings to the same bitline via appropriate selection via selection voltages applied to the appropriate sting selection lines SSL1 to SSL3 and ground selection lines GSL1 to GSL3.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1 to GSL3 and the string selection lines SSL1 to SSL3 may be separated. Memory cells located at the same semiconductor layer share a wordline. Cell strings in the same row share a string selection line. The common source line CSL is connected in common to all of the cell strings.

In FIG. 4, the memory block BLKi is illustrated to be connected to eight wordlines WL1 to WL8 and three bitlines BL1 to BL3, and each of the cell strings NS11 to NS33 is illustrated to include eight memory cells MC1 to MC8. However, example embodiments are not limited thereto. In some example embodiments, each memory block may be connected to any number of wordlines and bitlines, and each cell string may include any number of memory cells.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory device according to example embodiments is described based on a NAND flash memory device, example embodiments are not limited thereto, and the memory device according to example embodiments may be any memory device that includes a charge recycling memory block for a charge recycling operation and performs a wordline setup operation and a recovery operation during a specific operation. For example, the memory device according to example embodiments may include at least one of various nonvolatile memory devices, e.g., a phase random access memory (PRAM), a resistive random access memory (RRAM), a magnetic random access memory (MRAM), a ferroelectric random access memory (FRAM), a nano floating gate memory (NFGM), a polymer random access memory (PoRAM), a thyristor random access memory (TRAM), etc., and/or at least one of various volatile memory devices, e.g., a dynamic random access memory (DRAM), a static random access memory (SRAM), etc.

Figure 5A:
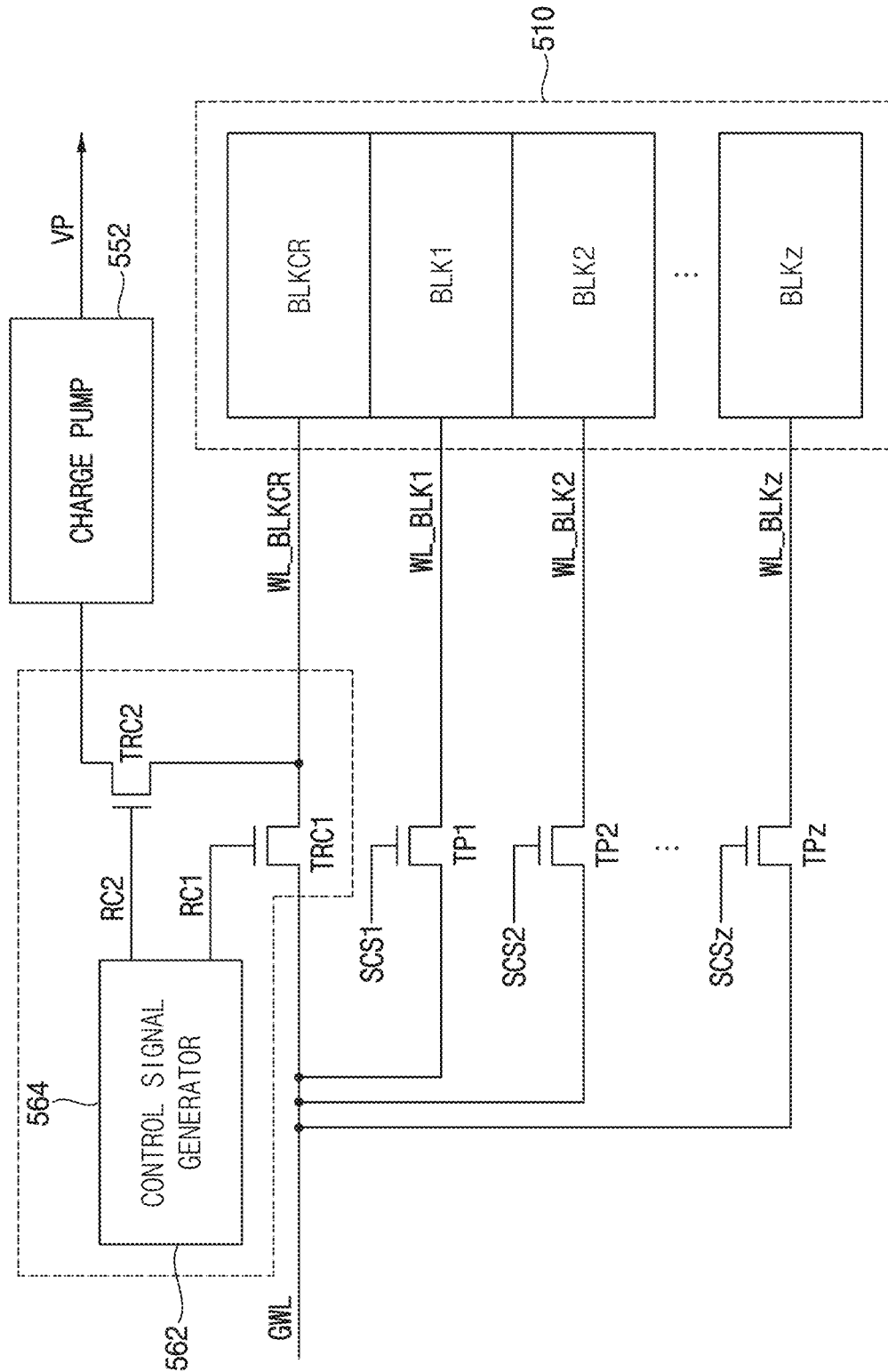

FIGS. 5A and 5B are diagrams illustrating an example of a memory cell array and an example of a charge recycling control circuit included in a memory device of FIG. 2.

Referring to FIG. 5A, the memory cell array 510 may include the charge recycling memory block BLKCR and the plurality of memory blocks BLK1 to BLKz.

The charge recycling memory block BLKCR may be connected to a charge recycling wordline WL_BLKCR, e.g., a dummy wordline. The plurality of memory blocks BLK1 to BLKz may be connected to a plurality of wordlines WL_BLK1, WL_BLK2, ..., WL_BLKz, respectively. The plurality of wordlines WL_BLK1 to WL_BLKz may be selectively connected to a global wordline GWL through a plurality of pass transistors TP1, TP2, ..., TPz, respectively, and the plurality of pass transistors TP1 to TPz may be turned on/off in response to a plurality of switching control signals SCS1, SCS2, ..., SCSz, respectively. For example, the plurality of pass transistors TP1 to TPz may be included in the address decoder 520 in FIG. 2.

The charge recycling control circuit 562 may include a first transistor TRC1 and a control signal generator 564, and may further include a second transistor TRC2. The charge recycling wordline WL_BLKCR may be selectively connected to one of the plurality of wordlines WL_BLK1 to WL_BLKz through the first transistor TRC1 that is turned on/off in response to a first control signal RC1, and the charge recycling wordline WL_BLKCR may be selectively connected to the charge pump 552 through the second transistor TRC2 that is turned on/off in response to a second control signal RC2. In other words, the first transistor TRC1 may electrically connect the charge recycling wordline WL_BLKCR with one of the plurality of wordlines WL_BLK1 to WL_BLKz based on the first control signal RC1, and the second transistor TRC2 may electrically connect the charge recycling wordline WL_BLKCR and the charge pump 552 based on the second control signal RC2. The control signal generator 564 may generate the first and second control signals RC1 and RC2.

For example, when the method of operating the memory device according to example embodiments is performed on the memory block BLK1, the pass transistor TP1 and the first transistor TRC1 may be turned on, and the wordline WL_BLK1 and the charge recycling wordline WL_BLKCR may be electrically connected to each other. Thereafter, charges stored in the wordline WL_BLK1 may move (or transfer) to and be stored in the charge recycling memory block BLKCR through the charge recycling wordline WL_BLKCR based on the charge sharing operation. In addition, charges stored in the charge recycling memory block BLKCR may move to the wordline WL_BLK1 through the charge recycling wordline WL_BLKCR based on the charge sharing operation.

The charge pump 552 may generate a charge pump voltage VP used to generate the driving voltages VS. For example, when the second transistor TRC2 is turned on and electrically connected to the charge recycling wordline WL_BLKCR, the charge pump 552 may generate the charge pump voltage VP based on charges supplied from the charge recycling memory block BLKCR. When the second transistor TRC2 is turned off and is not electrically connected to the charge recycling wordline WL_BLKCR, the charge pump 552 may generate the charge pump voltage VP by itself.

Referring to FIG. 5B, the memory block BLK1 may include a plurality of pages PG11, PG12, ..., PG1k. The descriptions repeated with FIG. 5A will be omitted for brevity.

The plurality of pages PG11 to PG1k may be connected to a plurality of wordlines WL_PG11, WL_PG12, ..., WL_PG1k, respectively. The plurality of wordlines WL_PG11 to WL_PG1k may be selectively connected to the global wordline GWL through a plurality of pass transistors TP11, TP12, ..., TP1k, respectively, and the plurality of pass transistors TP11 to TP1k may be turned on/off in response to a plurality of switching control signals SCS11, SCS12, ..., SCS1k, respectively. For example, the plurality of wordlines WL_PG11 to WL_PG1k may be included in the wordline WL_BLK1 of FIG. 5A, the plurality of switching control signals SCS11 to SCS1k may be included in the switching control signal SCS1 of FIG. 5A, and the plurality of pass transistors TP11 to TP1k may be included in the pass transistor TP1 of FIG. 5A.

In the method of operating the memory device according to example embodiments, each of the read operation and the program operation may be performed by units of pages (or page-by-page basis). Thus, when the method of operating the memory device according to example embodiments is performed on the memory block BLK1 and the first operation of S100 is performed on the page PG11, the wordline WL_PG11 may be a selected wordline, and the wordlines WL_PG12 to WL_PG1k other than the wordline WL_PG11 may be unselected wordlines.

Although not illustrated in detail, the remaining memory blocks BLK2 to BLKz may be implemented similarly to the memory block BLK1.

Hereinafter, example embodiments will be described based on an example where the charge recycling operation is performed on the memory block BLK1.

Figure 6:
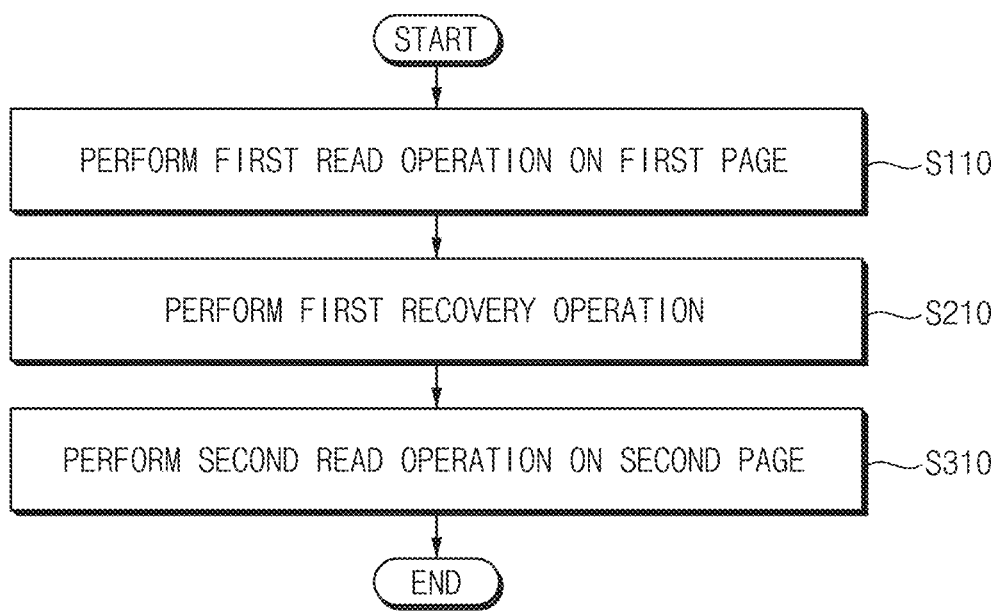
FIG. 6 is a flowchart illustrating an example of a method of operating a memory device of FIG. 1.

FIG. 6 is a flowchart illustrating an example of a method of operating a memory device of FIG. 1.

Referring to FIGS. 1, 5B and 6, in operation S100, a first read operation may be performed on the first page PG11 that is included in the memory block BLK1 and connected to the first wordline WL_PG11 among the plurality of wordlines WL_PG11 to WL_PG1k (operation S110). In operation S200, a first recovery operation may be performed on the plurality of wordlines WL_PG11 to WL_PG1k (operation S210). In operation S300, a second read operation may be performed on the second page PG12 that is included in the memory block BLK1 and connected to the second wordline WL_PG12 different from the first wordline WL_PG11 among the plurality of wordlines WL_PG11 to WL_PG1k (operation S310). In other words, FIG. 6 illustrates an example where the first operation is the first read operation and the second operation is the second read operation.

Figure 7:
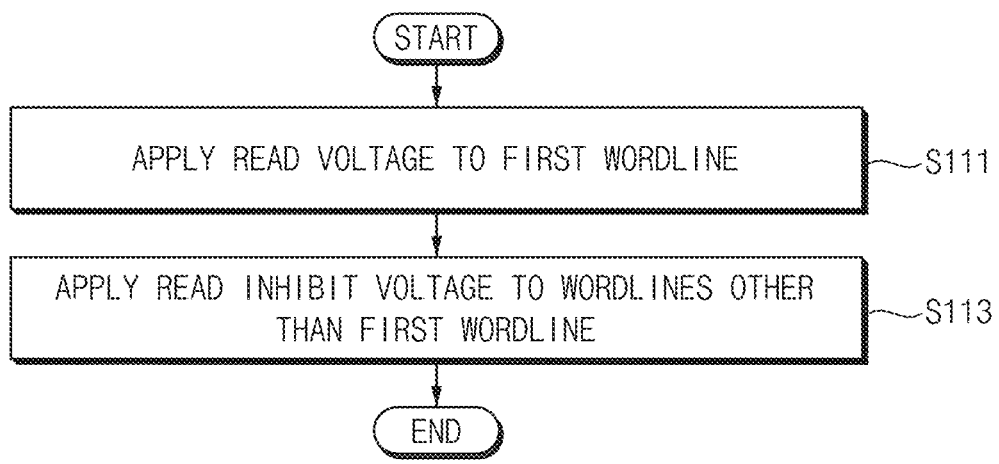
FIG. 7 is a flowchart illustrating an example of a method of performing a first read operation in FIG. 6.
Figure 8:
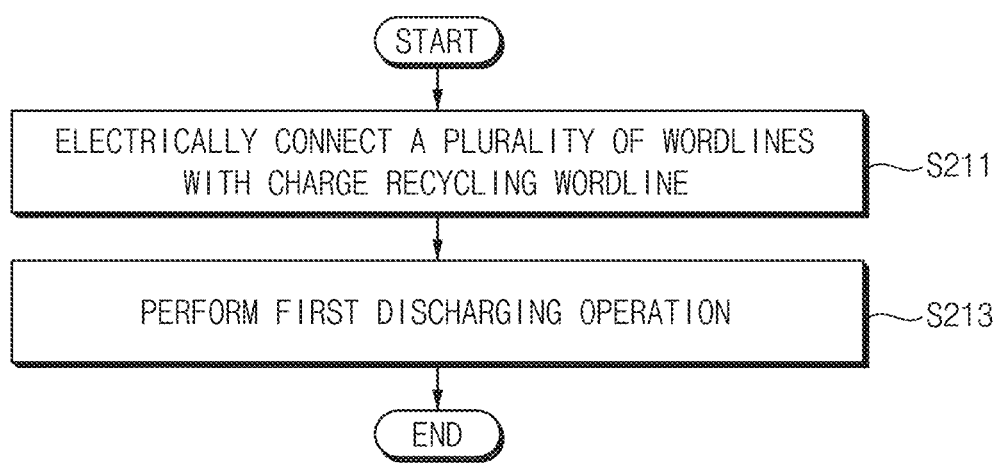
FIG. 8 is a flowchart illustrating an example of a method of performing a first recovery operation in FIG. 6.
Figure 9:
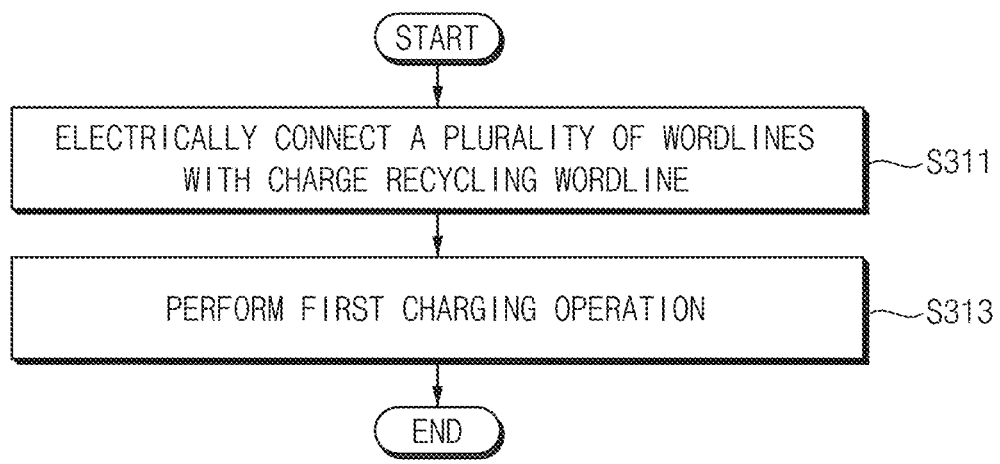
FIG. 9 is a flowchart illustrating an example of a method of performing a second read operation in FIG. 6.
Figure 10:
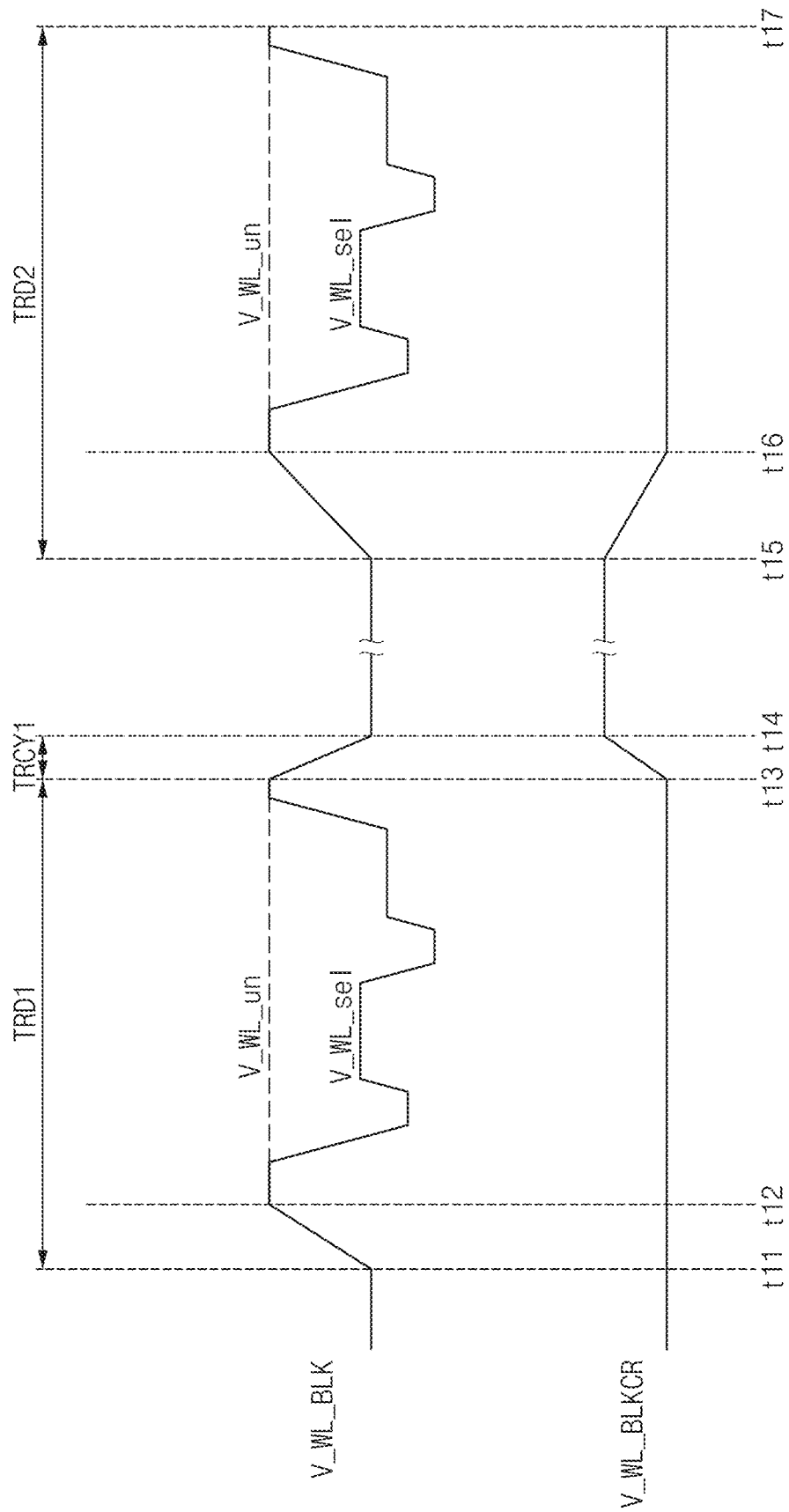
FIG. 10 is a diagram for describing operations of FIGS. 7, 8 and 9.

FIG. 7 is a flowchart illustrating an example of a method of performing a first read operation in FIG. 6. FIG. 8 is a flowchart illustrating an example of a method of performing a first recovery operation in FIG. 6. FIG. 9 is a flowchart illustrating an example of a method of performing a second read operation in FIG. 6. FIG. 10 is a diagram for describing operations of FIGS. 7, 8 and 9.

Referring to FIGS. 6, 7 and 10, in operation S110, the read voltage VRD may be applied to the first wordline WL_PG11 (operation S111). The read inhibit voltage VRDI may be applied to the wordlines WL_PG21 to WL_PG1k other than the first wordline WL_PG11 among the plurality of wordlines WL_PG11 to WL_PG1k (operation S113). The first wordline WL_PG11 may be referred to as the selected wordline, and the wordlines WL_PG21 to WL_PG1k other than the first wordline WL_PG11 may be referred to as the unselected wordlines.

For example, a first read interval TRD1 from time point t11 to time point t13 in FIG. 10 may correspond to a time interval in which the first read operation of S110 is performed. In FIG. 10 and subsequent figures, 'V_WL_BLK' represents level changes in voltages of the wordlines WL_PG11 to WL_PG1k connected to the memory block BLK1, which is a target of the charge recycling operation, 'V_WL_BLKCR' represents a level change in a voltage of the charge recycling wordline WL_BLKCR connected to the charge recycling memory block BLKCR. In 'V_WL_BLK', 'V_WL_sel' illustrated by a solid line represents a level change in a voltage of the selected wordline, and 'V_WL_un' illustrated by a dotted line represents a level change in a voltage of the unselected wordline.

In a time interval from time point t11 to time point t12 of the first read interval TRD1, the wordlines WL_PG11 to WL_PG1k may be set up to perform the first read operation.

For example, at an initial operation time, no charges may be stored in the charge recycling memory block BLKCR, and the wordlines WL_PG11 to WL_PG1k may be set up without moving charges by the charge sharing operation. However, example embodiments are not limited thereto.

Thereafter, in a time interval from time point t12 to time point t13 of the first read interval TRD1, data stored in the first page PG11 may be read or retrieved based on the read voltage VRD applied to the selected wordline and the read inhibit voltage VRDI applied to the unselected wordlines. Since a process of reading data is widely known to those skilled in the art, a detailed description thereof will be omitted.

Referring to FIGS. 6, 8 and 10, in operation S210, the plurality of wordlines WL_PG11 to WL_PG1k connected to the memory block BLK1 may be electrically connected with the charge recycling wordline WL_BLKCR (operation S211). For example, the first transistor TRC1 and the plurality of pass transistors TP11 to TP1k in FIG. 5B may be turned on.

As the plurality of wordlines WL_PG11 to WL_PG1k and the charge recycling wordline WL_BLKCR are electrically connected with each other, a first discharging operation in which voltage levels of the plurality of wordlines WL_PG11 to WL_PG1k decrease may be performed (operation S213). For example, based on the charge sharing operation, charges in the wordlines WL_PG11 to WL_PG1k may move (or transfer) to and stored in the charge recycling memory block BLKCR through the charge recycling wordline WL_BLKCR.

For example, a first recovery interval TRCY1 from time point t13 to time point t14 in FIG. 10 may correspond to a time interval in which the first recovery operation of S210 is performed. When the first discharging operation is performed, the voltage levels of the plurality of wordlines WL_PG11 to WL_PG1k may decrease. For example, the charges may be stored not only in the charge recycling memory block BLKCR but also in the charge recycling wordline WL_BLKCR, and thus a voltage level of the charge recycling wordline WL_BLKCR may increase.

When the first recovery interval TRCY1 is terminated, the wordlines WL_PG11 to WL_PG1k may be electrically disconnected from the charge recycling wordline WL_BLKCR. For example, the first transistor TRC1 and the pass transistors TP11 to TP1k may be turned off.

Referring to FIGS. 6, 9 and 10, in operation S310, the plurality of wordlines WL_PG11 to WL_PG1k may be electrically connected with the charge recycling wordline WL_BLKCR (operation S311). Operation S311 may be similar to operation S211 in FIG. 8.

As the plurality of wordlines WL_PG11 to WL_PG1k and the charge recycling wordline WL_BLKCR are electrically connected with each other, a first charging operation in which the voltage levels of the plurality of wordlines WL_PG11 to WL_PG1k increase may be performed (operation S313). For example, based on the charge sharing operation, the charges in the charge recycling memory block BLKCR may move to and stored in the wordlines WL_PG11 to WL_PG1k through the charge recycling wordline WL_BLKCR.

For example, a second read interval TRD2 from time point t15 to time point t17 in FIG. 10 may correspond to a time interval in which the second read operation of S310 is performed. Operations for reading data stored in the second page PG12 in the second read interval TRD2, e.g., operations of applying the read voltage VRD to the second wordline WL_PG12 (e.g., the selected wordline) and applying the read inhibit voltage VRDI to the remaining wordlines WL_PG11 and WL_PG1k (e.g., the unselected wordlines), may be similar to those in the first read interval TRD1. Operations of setting up the wordlines WL_PG11 to WL_PG1k in the second read interval TRD2 may be different from those in the first read interval TRD1.

In a time interval from time point t15 to time point t16 of the second read interval TRD2, the wordlines WL_PG11 to WL_PG1k may be set up to perform the second read operation. For example, the charges stored in the charge recycling memory block BLKCR by the first recovery operation may move to the wordlines WL_PG11 to WL_PG1k. When the first charging operation is performed, the voltage levels of the plurality of wordlines WL_PG11 to WL_PG1k may increase, and the voltage level of the charge recycling wordline WL_BLKCR may decrease.

When the wordlines WL_PG11 to WL_PG1k are completely set up, the wordlines WL_PG11 to WL_PG1k may be electrically disconnected from the charge recycling wordline WL_BLKCR. For example, the first transistor TRC1 may be turned off.

Thereafter, in a time interval from time point t16 to time point t17 of the second read interval TRD2, the data stored in the second page PG12 may be read based on the read voltage VRD applied to the selected wordline and the read inhibit voltage VRDI applied to the unselected wordlines. The operation in the time interval from time point t16 to time point t17 may be similar to the operation in the time interval from time point t12 to time point t13.

Figure 11:
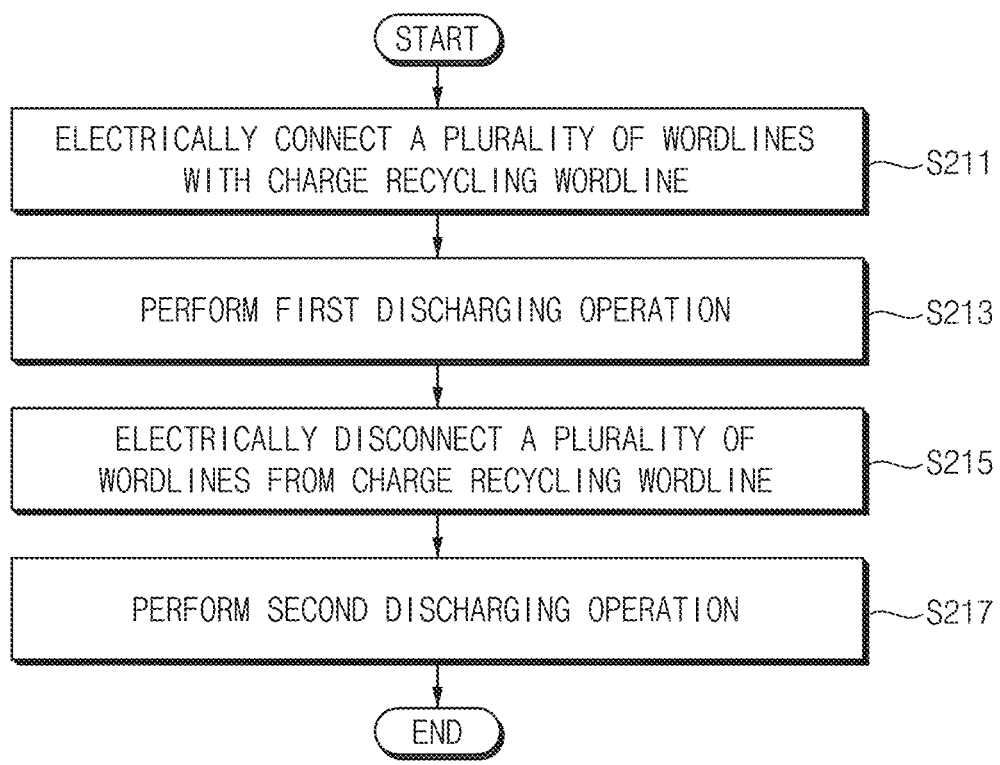
FIG. 11 is a flowchart illustrating an example of a method of performing a first recovery operation in FIG. 6.
Figure 12:
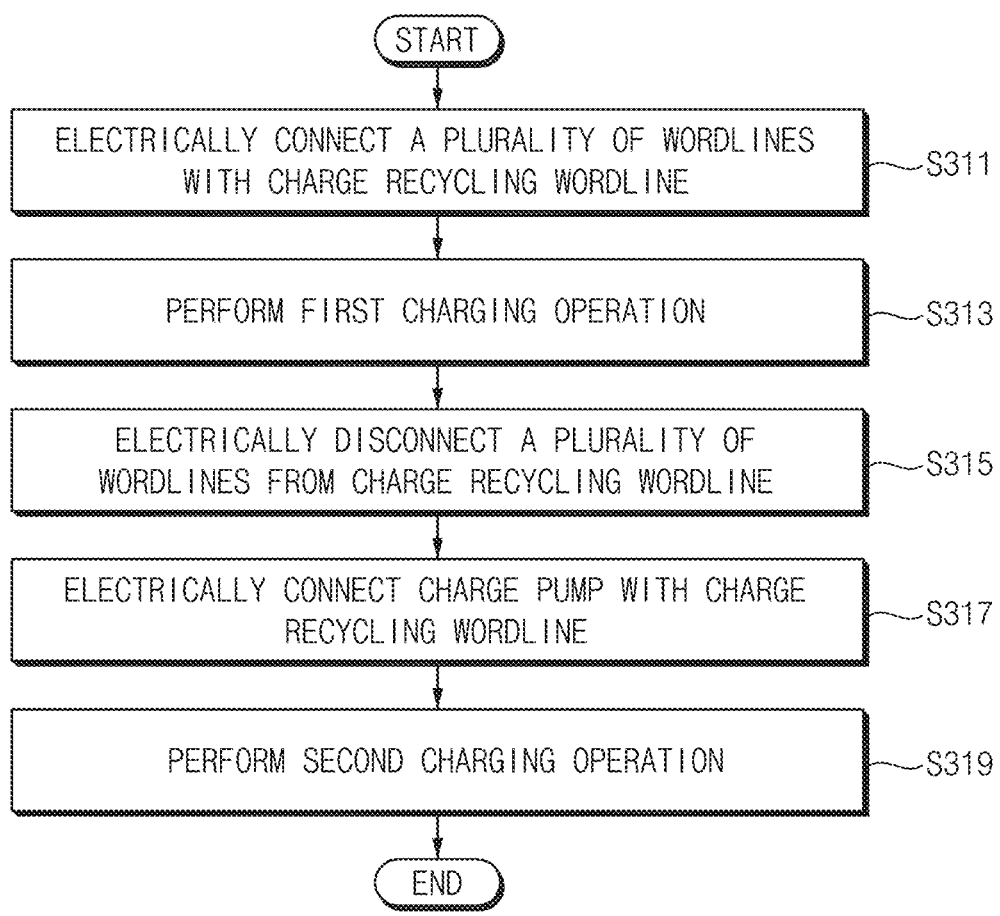
FIG. 12 is a flowchart illustrating an example of a method of performing a second read operation in FIG. 6.
Figure 13:
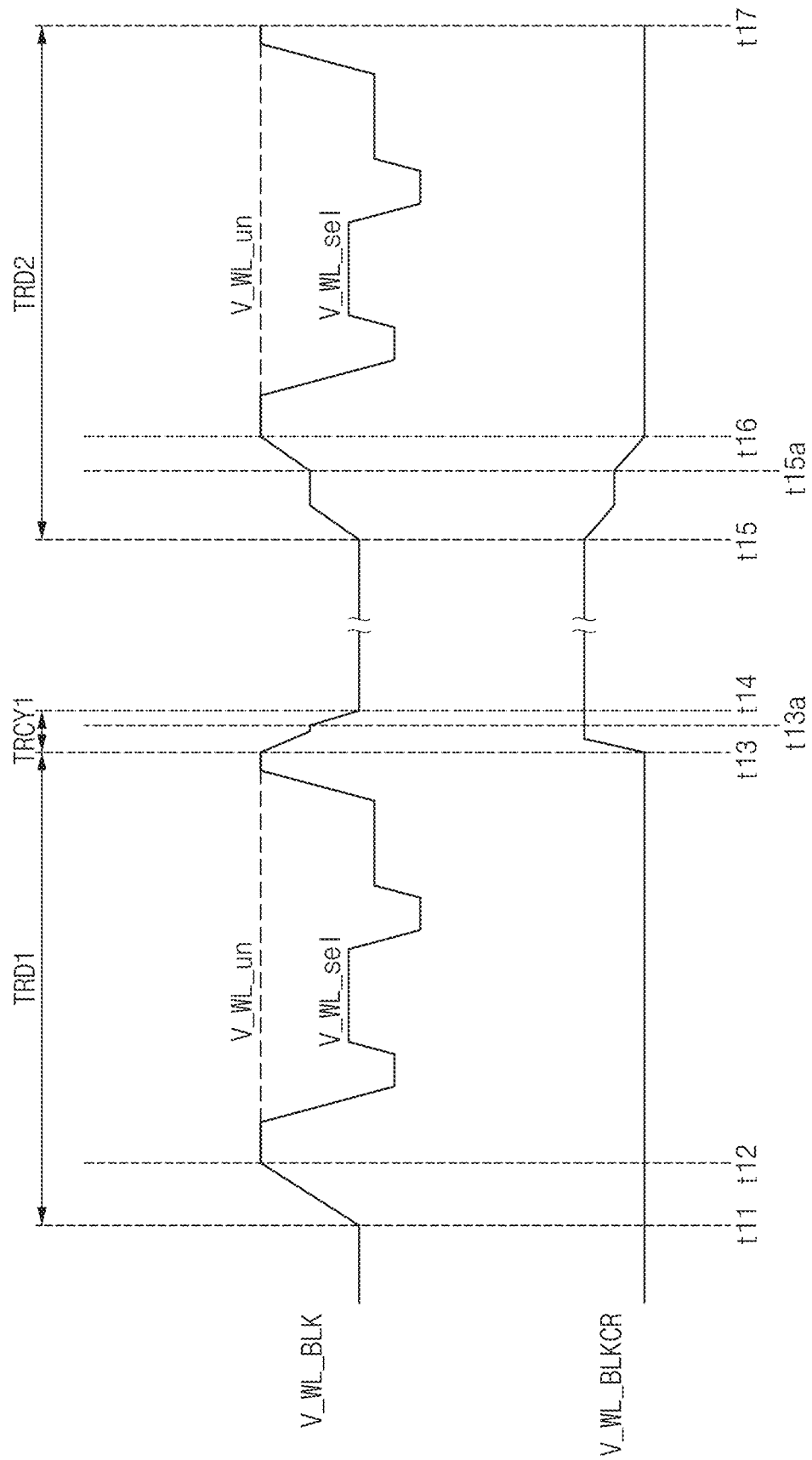
FIG. 13 is a diagram for describing operations of FIGS. 11 and 12.

FIG. 11 is a flowchart illustrating an example of a method of performing a first recovery operation in FIG. 6. FIG. 12 is a flowchart illustrating an example of a method of performing a second read operation in FIG. 6. FIG. 13 is a diagram for describing operations of FIGS. 11 and 12. The descriptions repeated with FIGS. 8, 9 and 10 will be omitted for brevity.

Referring to FIGS. 6, 11 and 13, in operation S210, operations S211 and S213 may be the same or substantially the same as those described with reference to FIGS. 8 and 10. For example, operations S211 and S213 may be performed in a time interval from time point t13 to time point t13a of a first recovery interval TRCY1 of FIG. 13.

Thereafter, the plurality of wordlines WL_PG11 to WL_PG1k may be electrically disconnected from the charge recycling wordline WL_BLKCR (operation S215). For example, the first transistor TRC1 in FIG. 5B may be turned off. A second discharging operation in which the voltage levels of the plurality of wordlines WL_PG11 to WL_PG1k additionally decrease may be performed (operation S217). For example, a target voltage for decreasing the voltage levels of the plurality of wordlines WL_PG11 to WL_PG1k may be applied to the plurality of wordlines WL_PG11 to WL_PG1k.

For example, operations S215 and S217 may be performed in a time interval from time point t13a to time point t14 of the first recovery section TRCY1 of FIG. 13. For example, the target voltage may be applied to the wordlines WL_PG11 to WL_PG1k such that the voltage levels of the wordlines WL_PG11 to WL_PG1k decreases to a first target level. In this example, since the charge recycling wordline WL_BLKCR is electrically disconnected and separated from the plurality of wordlines WL_PG11 to WL_PG1k, the voltage level of the charge recycling wordline WL_BLKCR may not decrease and may be maintained.

When only the first discharging operation based on the charge sharing operation is performed, it may require a relatively long time for the voltage levels of the wordlines WL_PG11 to WL_PG1k to decrease to the first target level. In contrast, when the first discharging operation is performed in the time interval from time point t13 to time point t13a and when the second discharging operation is performed in the time interval from time point t13a to time point t14, it may require a relatively short time for the voltage levels of the wordlines WL_PG11 to WL_PG1k to decrease to the first target level, and the first recovery operation may be efficiently performed.

When the first recovery interval TRCY1 is terminated, the pass transistors TP11 to TP1k may be turned off.

Referring to FIGS. 6, 12 and 13, in operation S310, operations S311 and S313 may be the same or substantially the same as those described with reference to FIGS. 9 and 10. For example, operations S311 and S313 may be performed in a time interval from time point t15 to time point t15a of a second read interval TRD2 of FIG. 13.

Thereafter, the plurality of wordlines WL_PG11 to WL_PG1k may be electrically disconnected from the charge recycling wordline WL_BLKCR (operation S315). Operation S315 may be similar to operation S215 in FIG. 11. The charge pump 552 may be electrically connected with the charge recycling wordline WL_BLKCR (operation S317). For example, the second transistor TRC2 in FIG. 5B may be turned on. A second charging operation in which the voltage levels of the plurality of wordlines WL_PG11 to WL_PG1k additionally increase using the charge pump 552 may be performed (operation S319). For example, the second charging operation may be performed using the charge pump voltage VP generated from the charge pump 552.

For example, operations S315, S317 and S319 may be performed in a time interval from time point t15a to time point t16 of the second read interval TRD2 of FIG. 13. The charge pump 552 may generate the charge pump voltage VP using the charges, which are provided from the charge recycling memory block BLKCR through the charge recycling wordline WL_BLKCR by the charge sharing operation, as a power source. The wordlines WL_PG11 to WL_PG1k may be set up using the charge pump voltage VP such that the voltage levels of the wordlines WL_PG11 to WL_PG1k increases to a second target level. As the charges are supplied to the charge pump 552, the voltage level of the charge recycling wordline WL_BLKCR may decrease.

When only the first charging operation based on the charge sharing operation is performed, it may require a relatively long time for the voltage levels of the wordlines WL_PG11 to WL_PG1k to increase to the second target level. In contrast, when the first charging operation is performed in the time interval from time point t15 to time point t15a and when the second charging operation is performed in the time interval from time point t15a to time point t16, it may require a relatively short time for the voltage levels of the wordlines WL_PG11 to WL_PG1k to increase to the second target level, and the wordlines WL_PG11 to WL_PG1k may be efficiently set up. In addition, the charges remaining after use in the first charging operation may be supplied as the power source of the charge pump 552, and thus the memory device may have improved power efficiency.

When the wordlines WL_PG11 to WL_PG1k are completely set up, the charge pump 552 may be electrically disconnected from the charge recycling wordline WL_BLKCR. For example, the second transistor TRC2 may be turned off.

In some example embodiments, the method of operating the memory device may be implemented by combining the examples of FIGS. 10 and 13. For example, only the first discharging operation may be performed in the first recovery interval TRCY1 as illustrated in FIG. 10, and both the first and second charging operations may be performed in the second read interval TRD2 as illustrated in FIG. 13. For example, both the first and second discharging operations may be performed in the first recovery interval TRCY1 as illustrated in FIG. 13, and only the first charging operation may be performed in the second read interval TRD2 as illustrated in FIG. 10.

Figure 14:
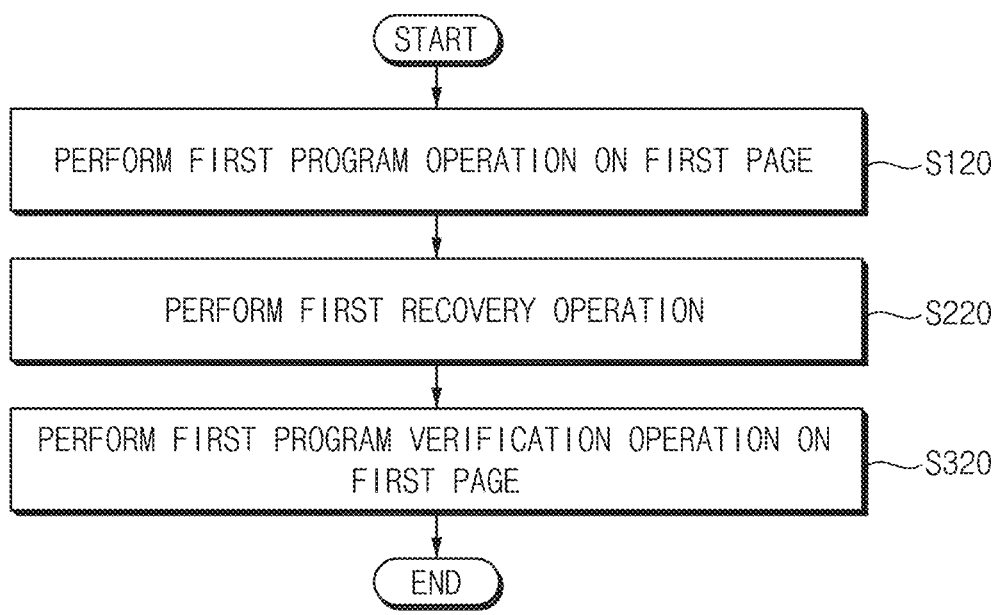
FIG. 14 is a flowchart illustrating an example of a method of operating a memory device of FIG. 1.

FIG. 14 is a flowchart illustrating an example of a method of operating a memory device of FIG. 1.

Referring to FIGS. 1, 5B and 14, in operation S100, a first program operation may be performed on the first page PG11 that is included in the memory block BLK1 and connected to the first wordline WL_PG11 among the plurality of wordlines WL_PG11 to WL_PG1k (operation S120). In operation S200, a first recovery operation may be performed on the plurality of wordlines WL_PG11 to WL_PG1k (operation S220). In operation S300, a first program verification operation may be performed on the first page PG11 (operation S320). In other words, FIG. 14 illustrates an example where the first operation is the first program operation and the second operation is the first program verification operation.

Figure 15:
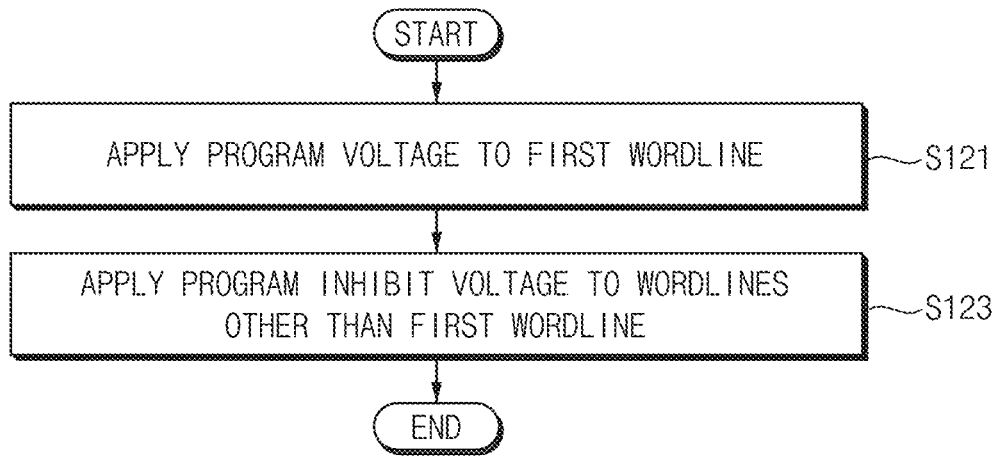
FIG. 15 is a flowchart illustrating an example of a method of performing a first program operation in FIG. 14.
Figure 16:
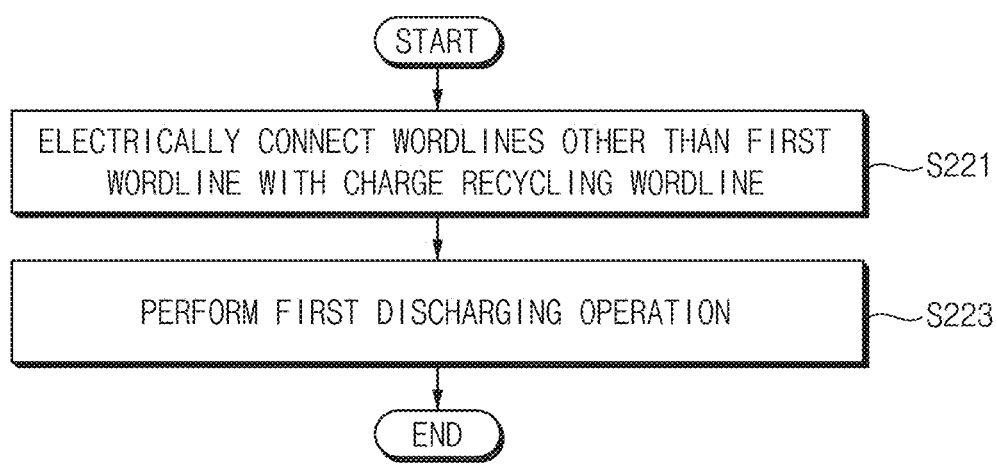
FIG. 16 is a flowchart illustrating an example of a method of performing a first recovery operation in FIG. 14.
Figure 17:
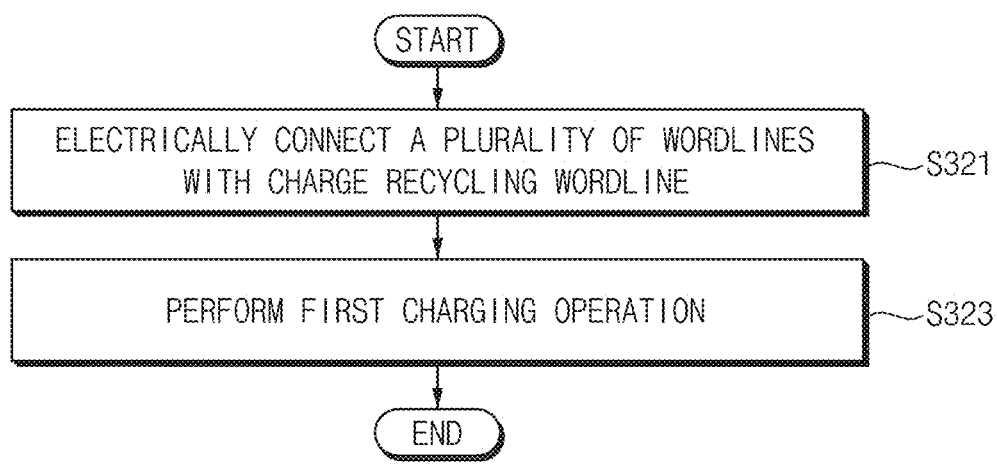
FIG. 17 is a flowchart illustrating an example of a method of performing a first program verification operation in FIG. 14.
Figure 18:
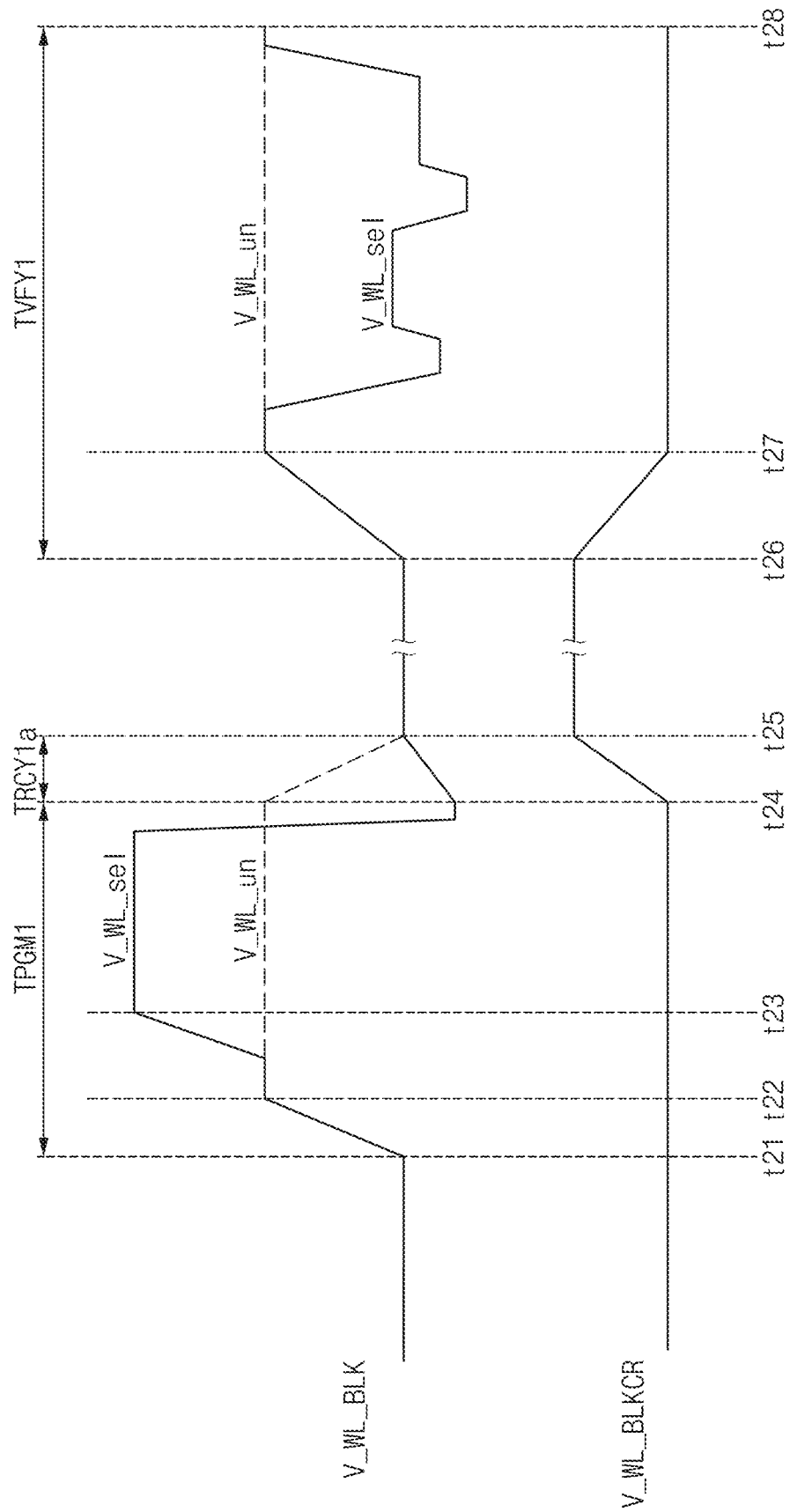
FIG. 18 is a diagram for describing operations of FIGS. 15, 16 and 17.

FIG. 15 is a flowchart illustrating an example of a method of performing a first program operation in FIG. 14. FIG. 16 is a flowchart illustrating an example of a method of performing a first recovery operation in FIG. 14. FIG. 17 is a flowchart illustrating an example of a method of performing a first program verification operation in FIG. 14. FIG. 18 is a diagram for describing operations of FIGS. 15, 16 and 17. The descriptions repeated with FIGS. 7, 8, 9 and 10 will be omitted for brevity.

Referring to FIGS. 14, 15 and 18, in operation S120, the program voltage VPGM may be applied to the first wordline WL_PG11, which is the selected wordline (operation S121). The program inhibit voltage VPGMI may be applied to the wordlines WL_PG21 to WL_PG1k, which are the unselected wordlines, other than the first wordline WL_PG11 among the plurality of wordlines WL_PG11 to WL_PG1k (operation S123).

For example, a first program interval TPGM1 from time point t21 to time point t24 in FIG. 18 may correspond to a time interval in which the first program operation of S120 is performed.

In a time interval from time point t21 to time point t22 of the first program interval TPGM1, the wordlines WL_PG11 to WL_PG1k may be set up to perform the first program operation. The operation in the time interval from time point t21 to time point t22 may be similar to the operation in the time interval from time point t11 to time point t12 in FIG. 10.

Thereafter, in a time interval from time point t22 to time point t23 of the first program interval TPGM1, the program voltage VPGM may be applied to the selected wordline. For example, the program voltage VPGM may be a relatively high voltage.

Thereafter, in a time interval from time point t23 to time point t24 of the first program interval TPGM1, data may be programmed or written into the first page PG11 based on the program voltage VPGM applied to the selected wordline and the program inhibit voltage VPGMI applied to the unselected wordlines. Since a process of programming data is widely known to those skilled in the art, a detailed description thereof will be omitted.

Referring to FIGS. 14, 16 and 18, in operation S220, the wordlines WL_PG21 to WL_PG1k, which are the unselected wordlines, other than the first wordline WL_PG11 among the plurality of wordlines WL_PG11 to WL_PG1k may be electrically connected with the charge recycling wordline WL_BLKCR (operation S221). For example, the first transistor TRC1 and the pass transistors TP12 to TP1k other than the pass transistor TP11 in FIG. 5B may be turned on.

A first discharging operation in which the voltage levels of all of the plurality of wordlines WL_PG11 to WL_PG1k decrease may be performed (operation S223). For example, as the unselected wordlines WL_PG21 to WL_PG1k are electrically connected with the charge recycling wordline WL_BLKCR, charges in the unselected wordlines WL_PG21 to WL_PG1k may move (or transfer) to and stored in the charge recycling memory block BLKCR through the charge recycling wordline WL_BLKCR based on the charge sharing operation. In addition, the selected wordline WL_PG11 to which a relatively high voltage is applied may be discharged by applying a separate voltage without the charge sharing operation.

For example, a first recovery interval TRCY1a from time point t24 to time point t25 in FIG. 18 may correspond to a time interval in which the first recovery operation of S220 is performed. The operation in the time interval from time point t24 to time point t25 may be similar to the operation in the time interval from time point t13 to time point t14 in FIG. 10, except that only the unselected wordlines WL_PG21 to WL_PG1k are used and the selected wordline WL_PG11 is not used.

Referring to FIGS. 14, 17 and 18, in operation S320, the plurality of wordlines WL_PG11 to WL_PG1k may be electrically connected with the charge recycling wordline WL_BLKCR (operation S321). A first charging operation in which the voltage levels of the plurality of wordlines WL_PG11 to WL_PG1k increase may be performed (operation S323). Operations S321 and S323 may be similar to operations S311 and S313 in FIG. 9, respectively.

For example, a first program verification interval TVFY1 from time point t26 to time point t28 in FIG. 18 may correspond to a time interval in which the first program verification operation of S320 is performed. The operation of the time interval from time point t26 to time point t27 and the operation of the time interval from time point t27 to time point t28 may be similar to the operation of the time interval from time point t15 to time point t16 and the operation of the time interval from time point t16 to time point t17 in FIG. 10, respectively, except that the program verification voltage VVF is applied to the selected wordline WL_PG11 and the verification inhibit voltage is applied to the unselected wordlines WL_PG12 to WL_PG1k for verifying the data programmed in the first page PG11.

Figure 19:
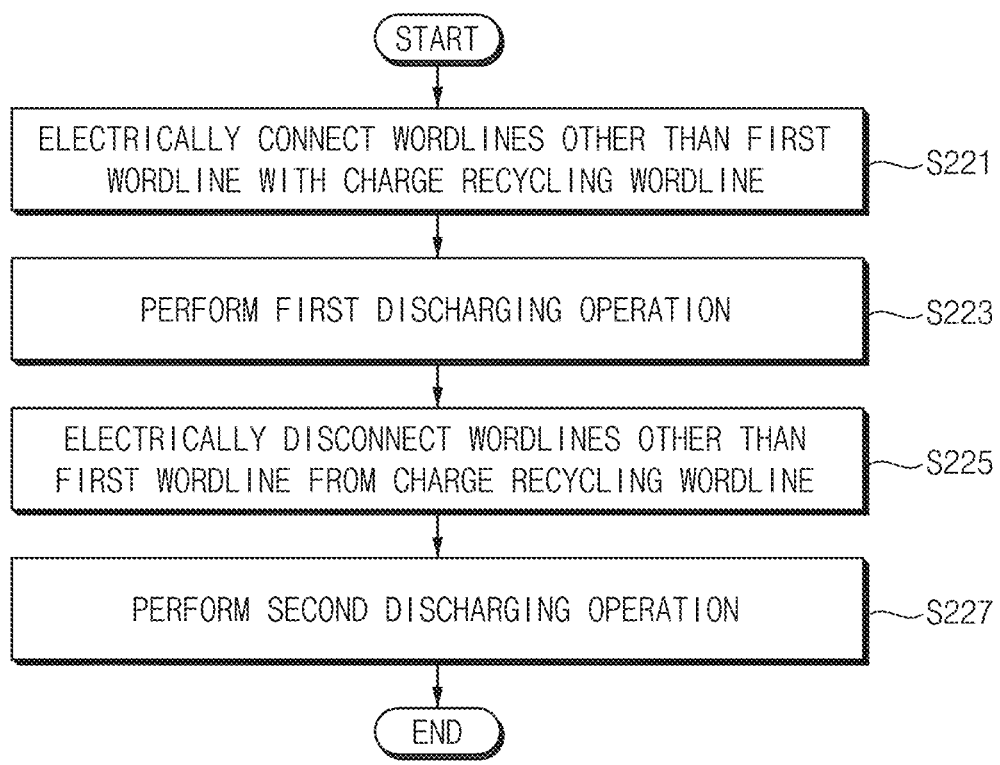
FIG. 19 is a flowchart illustrating an example of a method of performing a first recovery operation in FIG. 14.
Figure 20:
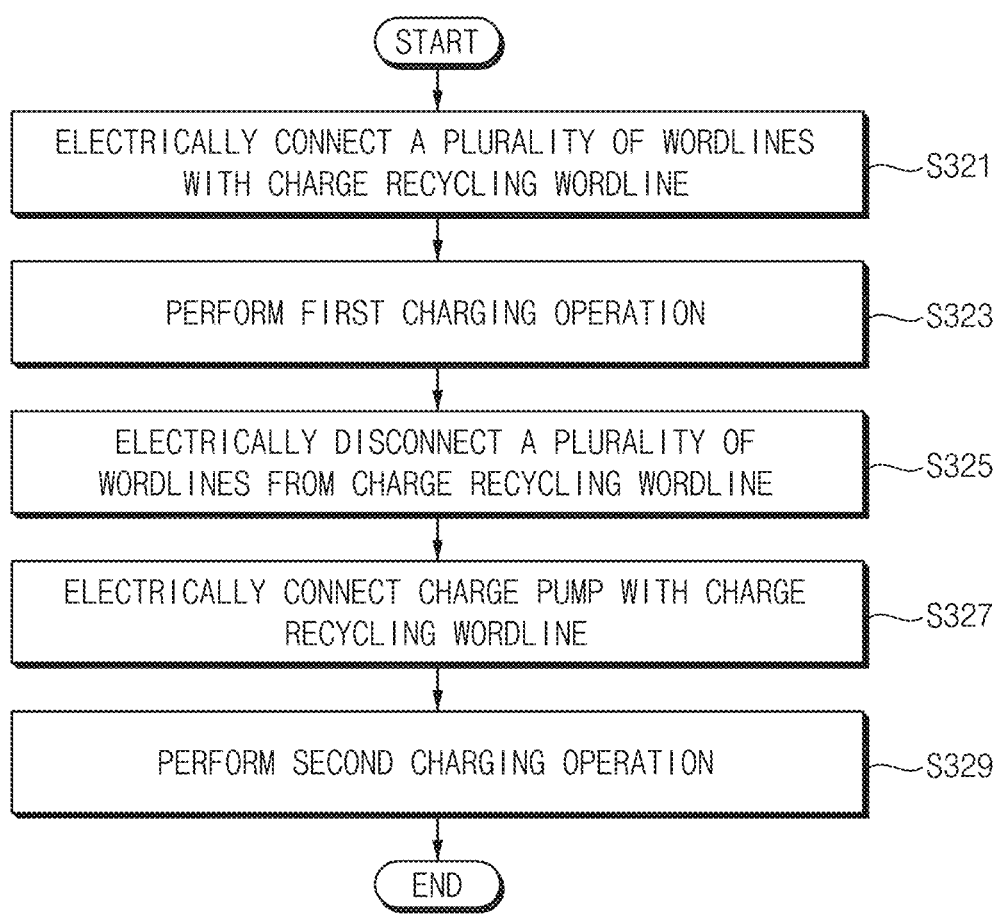
FIG. 20 is a flowchart illustrating an example of a method of performing a first program verification operation in FIG. 14.
Figure 21:
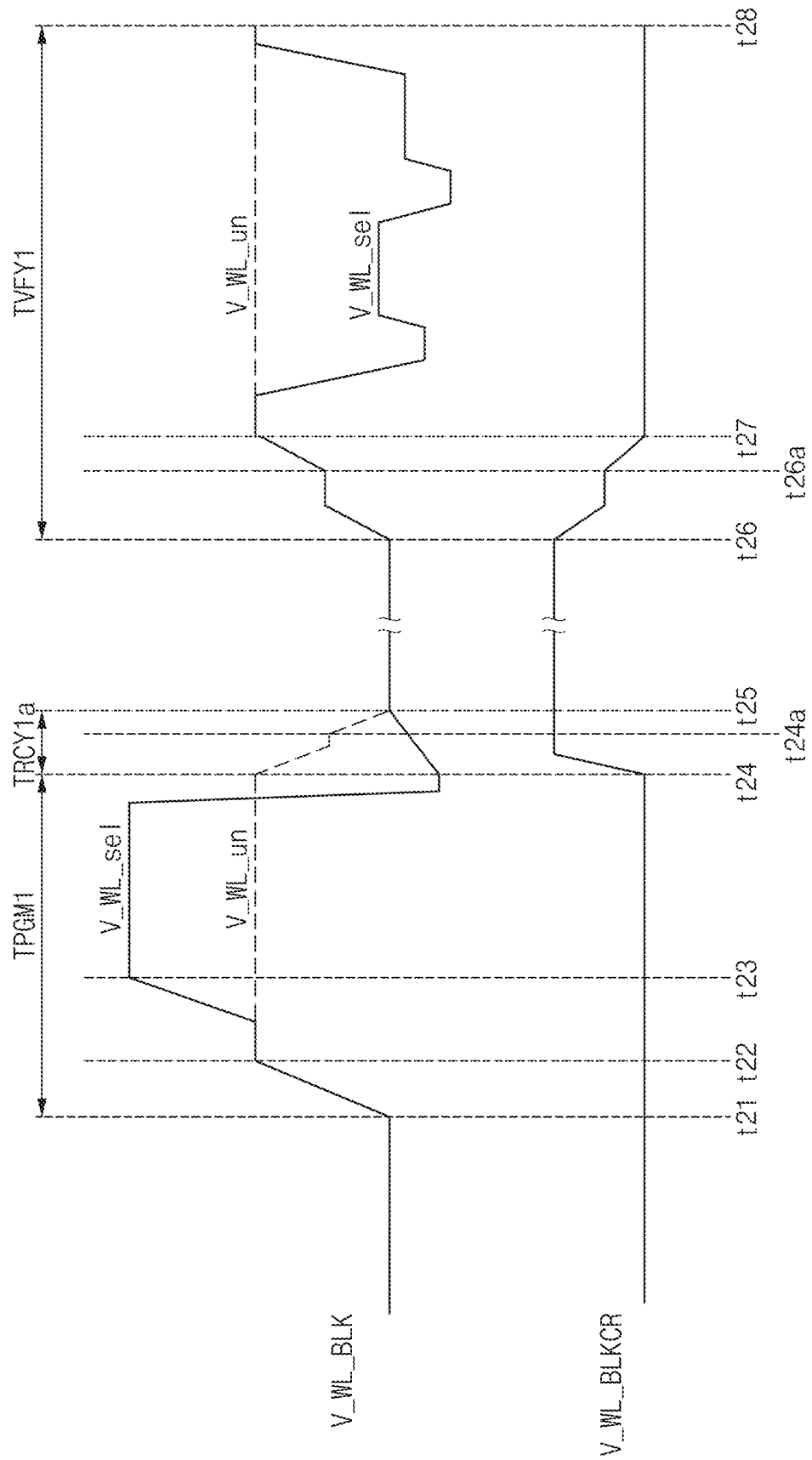
FIG. 21 is a diagram for describing operations of FIGS. 19 and 20.

FIG. 19 is a flowchart illustrating an example of a method of performing a first recovery operation in FIG. 14. FIG. 20 is a flowchart illustrating an example of a method of performing a first program verification operation in FIG. 14. FIG. 21 is a diagram for describing operations of FIGS. 19 and 20. The descriptions repeated with FIGS. 11, 12, 13, 16, 17 and 18 will be omitted for brevity.

Referring to FIGS. 14, 19 and 21, in operation S220, operations S221 and S223 may be the same or substantially the same as those described with reference to FIGS. 16 and 18. For example, operations S221 and S223 may be performed in a time interval from time point t24 to time point t24a of a first recovery interval TRCY1a of FIG. 21.

Thereafter, the wordlines WL_PG21 to WL_PG1k, which are unselected wordlines, other than the first wordline WL_PG11 may be electrically disconnected from the charge recycling wordline WL_BLKCR (operation S225). For example, the first transistor TRC1 in FIG. 5B may be turned off. A second discharging operation in which the voltage levels of the unselected wordlines WL_PG21 to WL_PG1k additionally decrease may be performed (operation S227). For example, a target voltage for decreasing the voltage levels of the unselected wordlines WL_PG21 to WL_PG1k may be applied to the unselected wordlines WL_PG21 to WL_PG1k.

For example, operations S225 and S227 may be performed in a time interval from time point t24a to time point t25 of the first recovery interval TRCY1a of FIG. 21. The operation of the time interval from time point t24a to time point t25 may be similar to the operation of the time interval from time point t13a to time point t14 in FIG. 13, except that only the unselected wordlines WL_PG21 to WL_PG1k are used.

Referring to FIGS. 14, 20 and 21, in operation S320, operations S321 and S323 may be the same or substantially the same as those described with reference to FIGS. 17 and 18. For example, operations S321 and S323 may be performed in a time interval from time point t26 to time point t26a of a first program verification interval TVFY1 of FIG. 21.

Thereafter, the plurality of wordlines WL_PG11 to WL_PG1k may be electrically disconnected from the charge recycling wordline WL_BLKCR (operation S325). The charge pump 552 may be electrically connected with the charge recycling wordline WL_BLKCR (operation S327). A second charging operation in which the voltage levels of the plurality of wordlines WL_PG11 to WL_PG1k additionally increase using the charge pump 552 may be performed (operation S329). For example, the second charging operation may be performed using the charge pump voltage VP generated from the charge pump 552. Operations S325, S327 and S329 may be similar to operations S315, S317 and S319 in FIG. 12, respectively. For example, the operation of the time interval from time point t26a to time point t27 and the operation of the time interval from time point t27 to time point t28 are may be similar to the operation of the time interval from time point t15a to time point t16 and the operation of the time interval from time point t16 to time point t17 in FIG. 13, respectively.

Although example embodiments are described with reference to FIGS. 18 and 21 that the first recovery operation is performed using only the unselected wordlines WL_PG21 to WL_PG1k in the first recovery interval TRCY1a after the first program interval TPGM1, example embodiments are not limited thereto. For example, as with those described with reference to FIGS. 8 and 11, the first recovery operation may be performed using all of the plurality of wordlines WL_PG11 to WL_PG1k, e.g., using both the selected wordline WL_PG11 and the unselected wordlines WL_PG21 to WL_PG1k, in the first recovery interval TRCY1a after the first program interval TPGM1.

In some example embodiments, the method of operating the memory device may be implemented by combining the examples of FIGS. 18 and 21.

Figure 22:
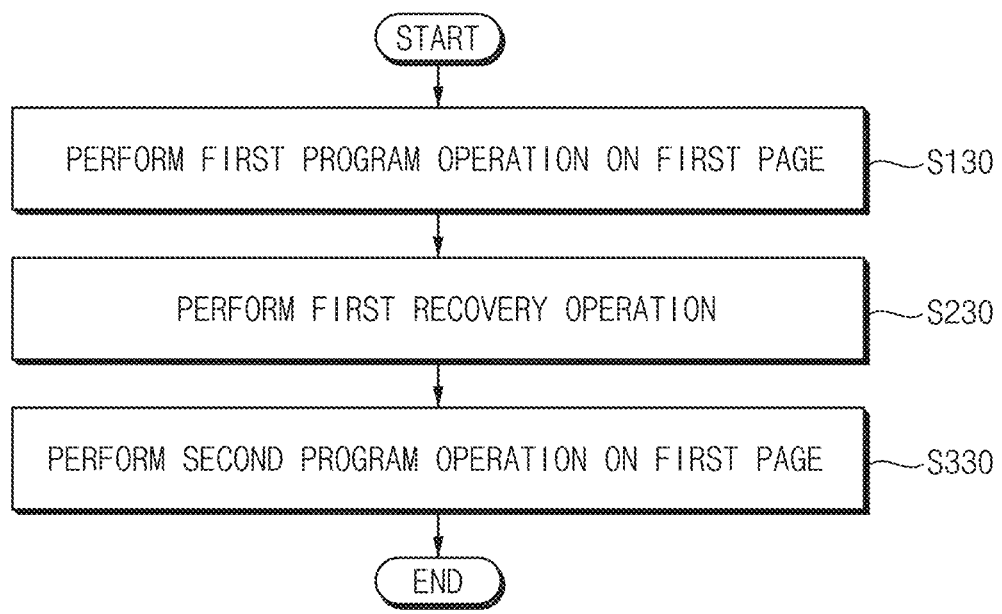
FIG. 22 is a flowchart illustrating an example of a method of operating a memory device of FIG. 1.

FIG. 22 is a flowchart illustrating an example of a method of operating a memory device of FIG. 1.

Referring to FIGS. 1, 5B and 22, in operation S100, a first program operation may be performed on the first page PG11 that is included in the memory block BLK1 and connected to the first wordline WL_PG11 among the plurality of wordlines WL_PG11 to WL_PG1k (operation S130). In operation S200, a first recovery operation may be performed on the plurality of wordlines WL_PG11 to WL_PG1k (operation S230). In operation S300, a second program operation may be performed on the first page PG11 (operation S330). In other words, FIG. 22 illustrates an example where the first operation is the first program operation and the second operation is the second program operation.

Figure 23A:
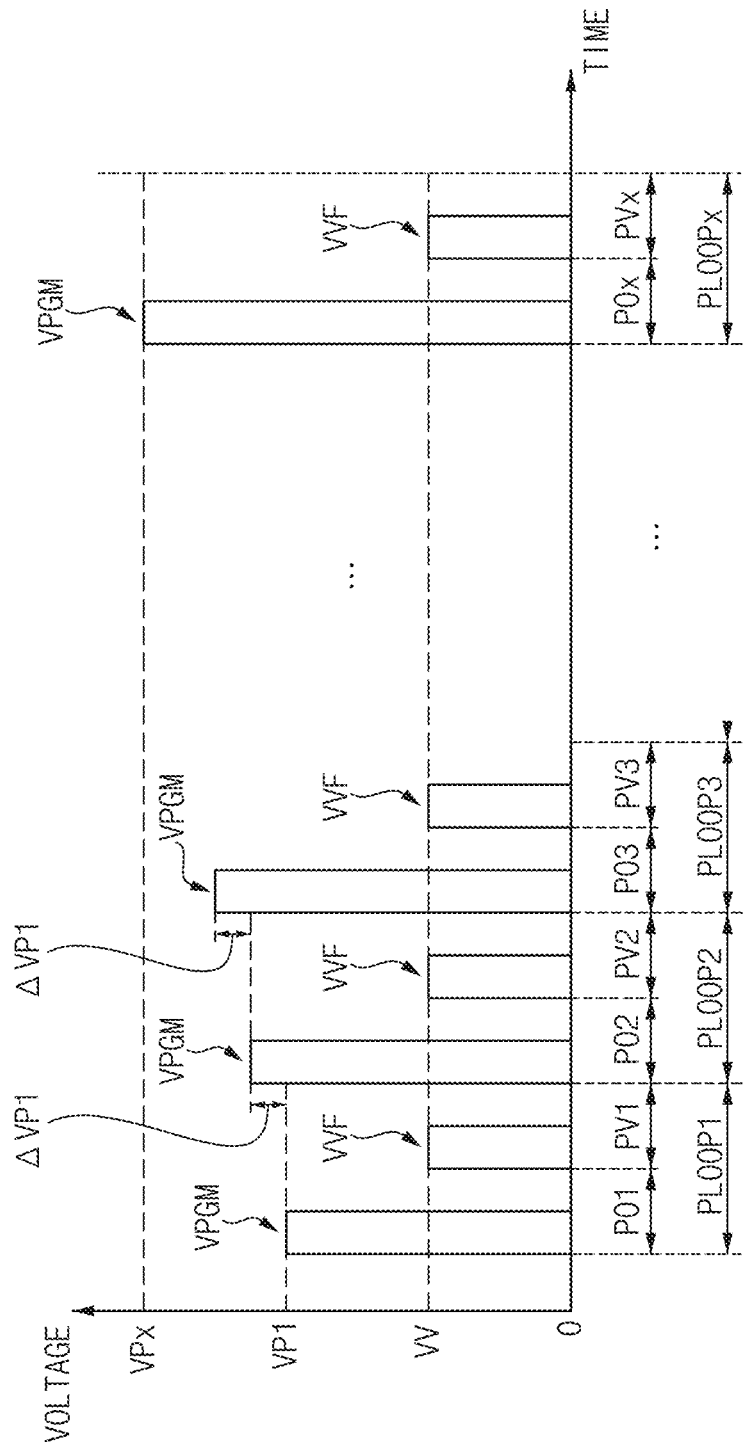
FIGS. 23A and 23B are diagrams for describing a program operation performed in a method of operating a memory device according to example embodiments.
Figure 23B:
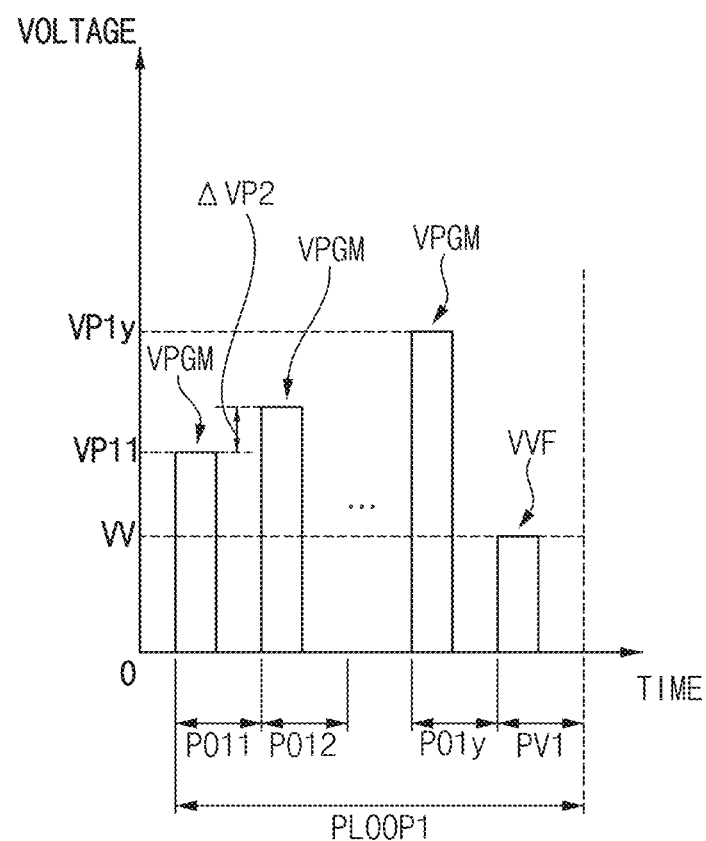

FIGS. 23A and 23B are diagrams for describing a program operation performed in a method of operating a memory device according to example embodiments.

Referring to FIG. 23A, the program operation may be performed based on an incremental step pulse program (ISPP) scheme.

For example, a plurality of program loops PLOOP1, PLOOP2, PLOOP3, . . . , PLOOPx may be sequentially performed, where x is a natural number greater than or equal to two. For each program loop, one of program operations PO1, PO2, PO3, . . . , Pox using the program voltage VPGM and a respective one of program verification operations PV1, PV2, PV3, . . . , PVx using the program verification voltage VVF may be sequentially performed. When a program operation and a program verification operation in a specific program loop (e.g., in the program loop PLOOP3) are successfully completed, subsequent program loops (e.g., the program loop PLOOPx) may not be performed, and the process may be terminated.

In some example embodiments, a voltage level of the program voltage VPGM in a current program loop may be higher than that of the program voltage VPGM in a previous program loop, and the program verification voltage VVF may have a constant voltage level VV. For example, in the first program loop PLOOP1, the program voltage VPGM may have a first voltage level (or an initial voltage level) VP1. In the second program loop PLOOP2, the program voltage VPGM may have a second voltage level that is increased by a first step level ΔVP1 from the first voltage level VP1. In the third program loop PLOOP3, the program voltage VPGM may have a third voltage level that is increased by the first step level ΔVP1 from the second voltage level of the program voltage VPGM in the second program loop PLOOP2. In the x-th program loop PLOOPK which is the last program loop, the program voltage VPGM may have an x-th voltage level (or a final voltage level) VPx.

Although FIG. 23A illustrates that only the voltage level of the program voltage VPGM increases as the program loops are repeatedly performed, example embodiments are not limited thereto, and the voltage level of the program verification voltage VVF may also increase. In addition, although FIG. 23A illustrates that the voltage level of the program voltage VPGM increases by a fixed level (e.g., the first step level ΔVP1) as the program loops are repeatedly performed, example embodiments are not limited thereto, and the amount of change in the program voltage VPGM may be changed for each program loop.

Referring to FIG. 23B, the program operation may be performed based on a multi-pulse program scheme. FIG. 23B illustrates an example of the first program loop PLOOP1 among the plurality of program loops PLOOP1 to PLOOPx in FIG. 23A.

Unlike a single-pulse program scheme in which one program loop includes only one program operation, one program loop may include two or more program operations in the multi-pulse program scheme. In addition, in the multi-pulse program scheme, the program voltage may be applied to the selected wordline multiple times during one program loop while level of the program voltage is changed. For example, the first program loop PLOOP1 may include program operations PO11, PO12, . . . , PO1y using the program voltage VPGM and a program verification operation PV1 using the program verification voltage VVF, where y is a natural number.

In some example embodiments, the multi-pulse program scheme may be implemented based on a low-to-high (L2H) scheme in which the level of the program voltage PGM increases as the program operations are repeated during one program loop. For example, while the first program loop PLOOP1 is being performed, the program voltage VPGM may have a first level VP1$a$ in the first program operation PO11, the level of the program voltage VPGM may be higher than the first level VP1$a$ by a second step level ΔVP2, and the program voltage VPGM may have a y-th level VP1$y$ in a y-th program operation PO1$y$ which is the last program operation.

Although FIG. 23B illustrates the L2H scheme in which the level of the program voltage VPGM increases as the program operation are repeated, example embodiments are not limited thereto. For example, the multi-pulse program scheme may be implemented based on a high-to-low (H2L) scheme in which the level of the program voltage PGM decreases as the program operations are repeated during one program loop.

As illustrated in FIG. 23B, the program operations are sequentially or continuously performed in in the multi-pulse program scheme, and thus the first operation may be the first program operation and the second operation may be the second program operation as illustrated in FIG. 22.

Figure 24:
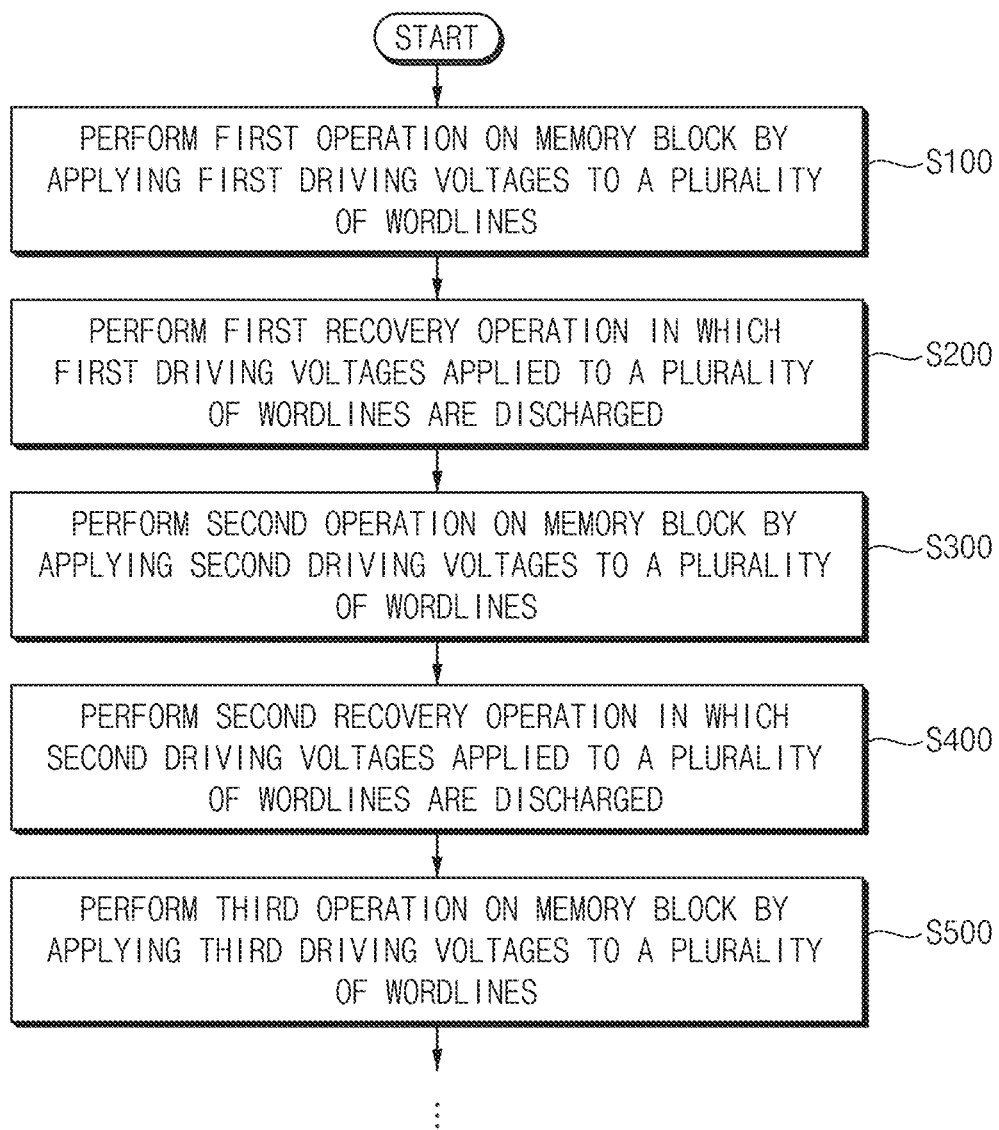
FIG. 24 is a flowchart illustrating a method of operating a memory device according to example embodiments.

FIG. 24 is a flowchart illustrating a method of operating a memory device according to example embodiments. The descriptions repeated with FIG. 1 will be omitted for brevity.

Referring to FIG. 24, in a method of operating a memory device according to example embodiments, operations S100, S200 and S300 may be the same or substantially the same as those described with reference to FIG. 1.

After the second operation is successfully completed, a second recovery operation in which the second driving voltages applied to the plurality of wordlines are discharged may be performed (operation S400). After the second recovery operation is successfully completed, a third operation is performed on the memory block by applying third driving voltages to the plurality of wordlines (operation S500). Thereafter, a recovery operation and a specific operation may be alternately and repeatedly performed. In other words, the recovery operation and the specific operation may be alternately and repeatedly performed on all pages included in the memory block.

Figure 25:
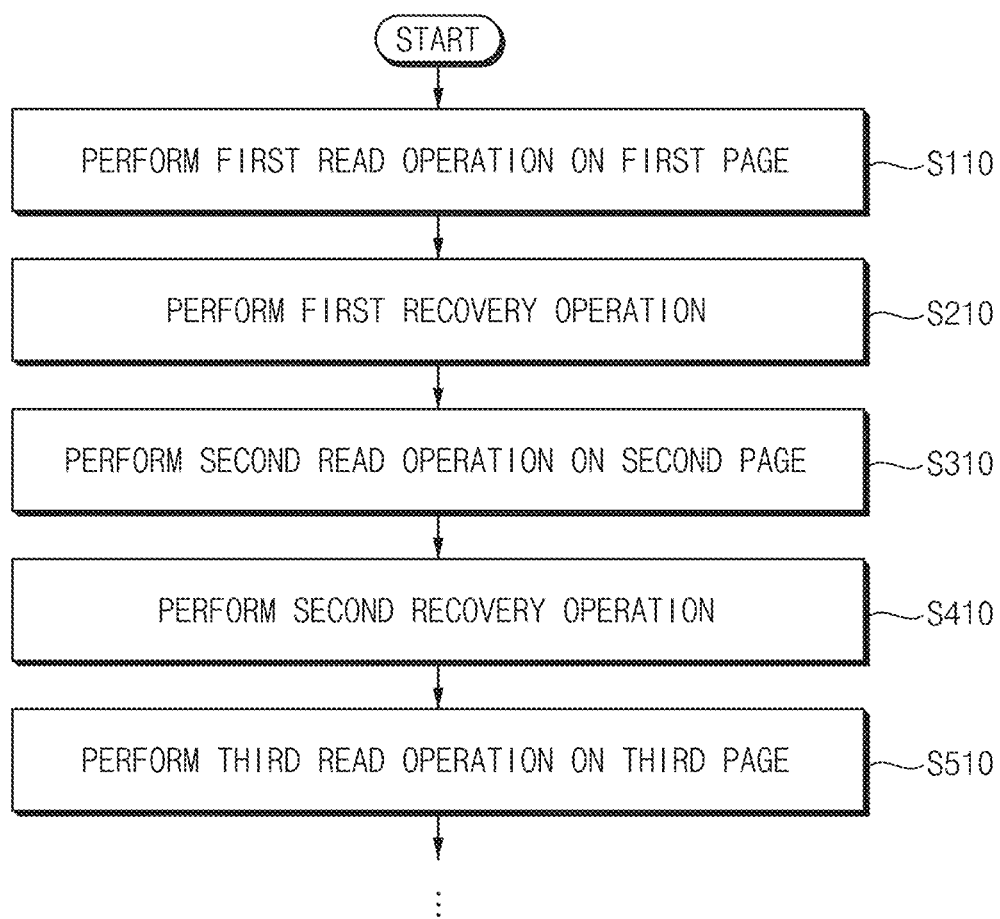
FIGS. 25, 26 and 27 are flowcharts illustrating examples of a method of operating a memory device of FIG. 24.
Figure 26:
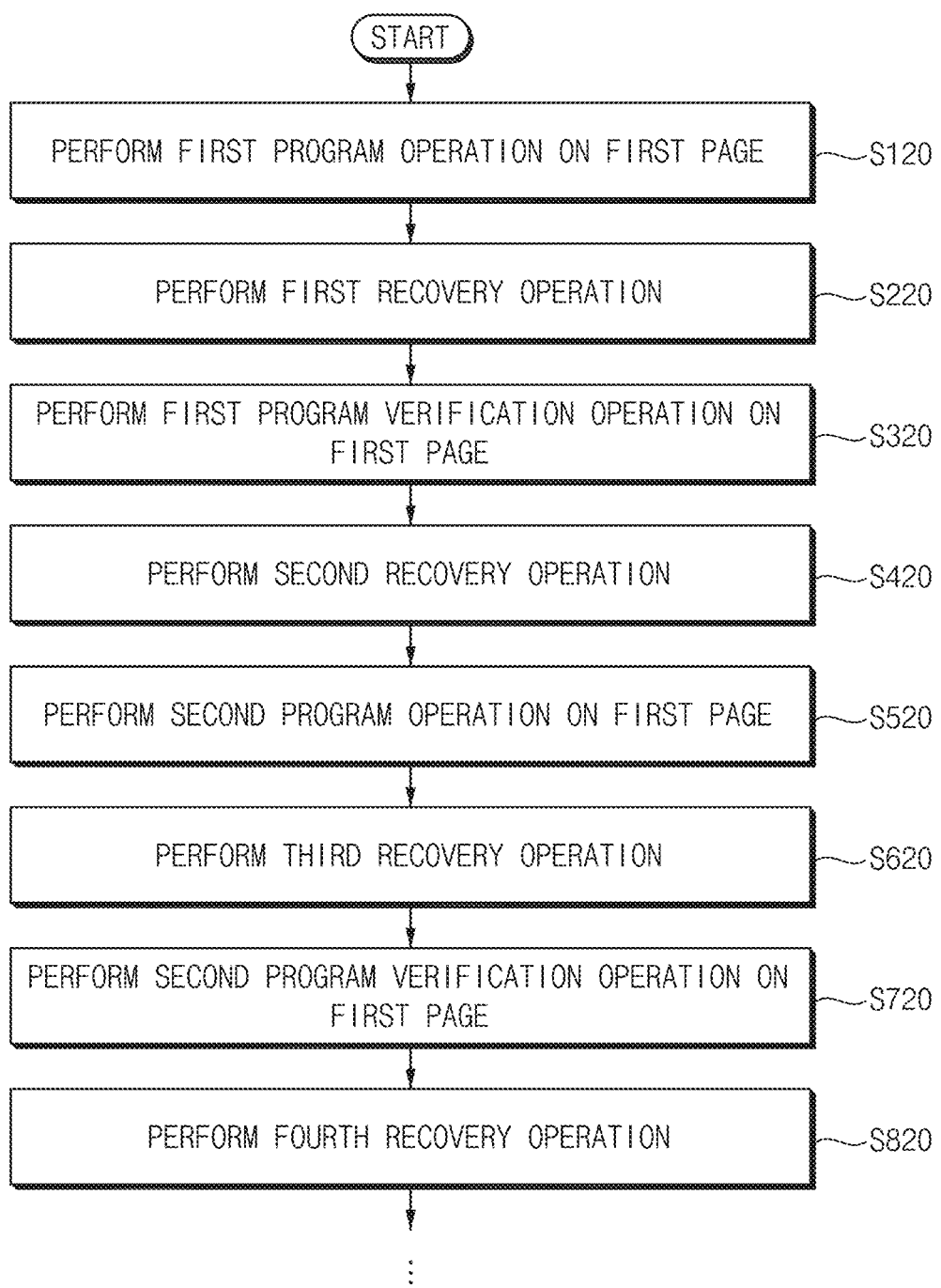
Figure 27:
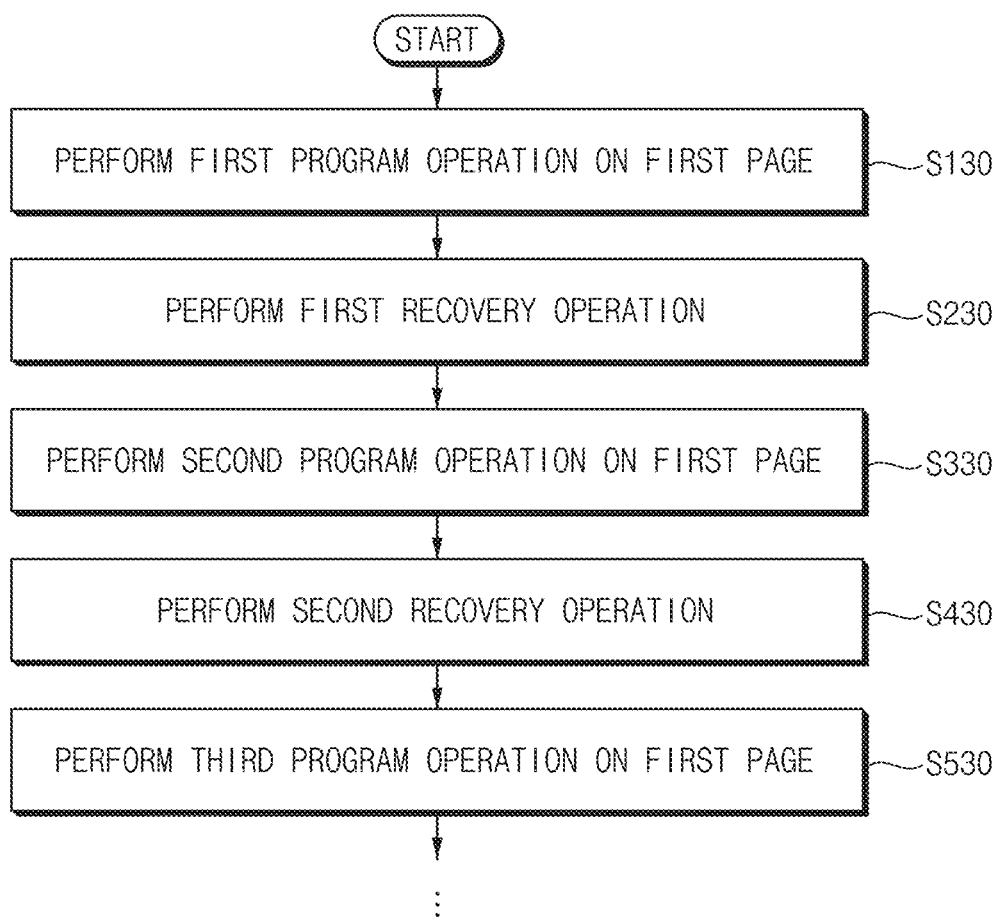

FIGS. 25, 26 and 27 are flowcharts illustrating examples of a method of operating a memory device of FIG. 24. The descriptions repeated with FIGS. 6, 14 and 22 will be omitted for brevity.

Referring to FIGS. 24 and 25, operations S110, S210 and S310 may be the same or substantially the same as those described with reference to FIG. 6. In operation S400, a second recovery operation may be performed on the plurality of wordlines WL_PG11 to WL_PG1$k$ (operation S410). In operation S500, a third read operation may be performed on a third page connected to a third wordline (operation S510). Operations S410 and S510 may be similar to operations S210 and S310, respectively.

Referring to FIGS. 24 and 26, operations S120, S220 and S320 may be the same or substantially the same as those described with reference to FIG. 14. In operation S400, a second recovery operation may be performed on the plurality of wordlines WL_PG11 to WL_PG1$k$ (operation S420). In operation S500, a second program operation may be performed on the first page PG11 (operation S520). Operations S420 and S520 may be similar to operations S220 and S120, respectively.

Thereafter, a third recovery operation may be performed on the plurality of wordlines WL_PG11 to WL_PG1$k$ (operation S620), a second program verification operation may be performed on the first page PG11 (operation S720), and a fourth recovery operation may be performed on the plurality of wordlines WL_PG11 to WL_PG1$k$ (operation S820). Operations S620, S720 and S820 may be similar to operations S220, S320 and S420, respectively.

Referring to FIGS. 24 and 27, operations S130, S230 and S330 may be the same or substantially the same as those described with reference to FIG. 22. In operation S400, a second recovery operation may be performed on the plurality of wordlines WL_PG11 to WL_PG1$k$ (operation S430). In operation S500, a third program operation may be performed on the first page PG11 (operation S530). Operations S430 and S530 may be similar to operations S230 and S330, respectively.

In some example embodiments, after the first page PG11 is successfully programmed in the examples of FIGS. 26 and 27, the remaining pages PG12 to PG1$k$ may be sequentially programmed.

Figure 28:
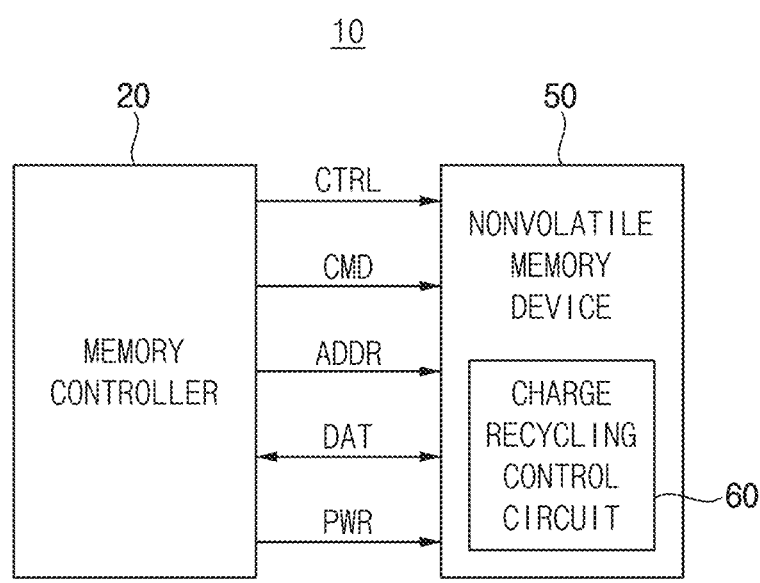
FIG. 28 is a block diagram illustrating a memory system including a memory device according to example embodiments.

FIG. 28 is a block diagram illustrating a memory system including a memory device according to example embodiments.

Referring to FIG. 28, a memory system 10 includes a memory controller 20 and a memory device (or nonvolatile memory device) 50.

The memory device 50 may perform data erase, write (or program) and/or read operations under control of the memory controller 20. The memory device 50 may receive a command CMD and an address ADDR through input/output (I/O) lines from the memory controller 20 for performing such data erase, write and/or read operations, and may exchange data DAT with the memory controller 20 for performing such data write and/or read operations. In addition, the memory device 50 may receive a control signal CTRL through a control line from the memory controller 20. Further, the memory device 50 may receive power PWR through a power line from the memory controller 20.

The memory device 50 may be the memory device according to example embodiments, may perform the method of operating the memory device according to example embodiments, and may include a charge recycling control circuit 60.

Figure 29:
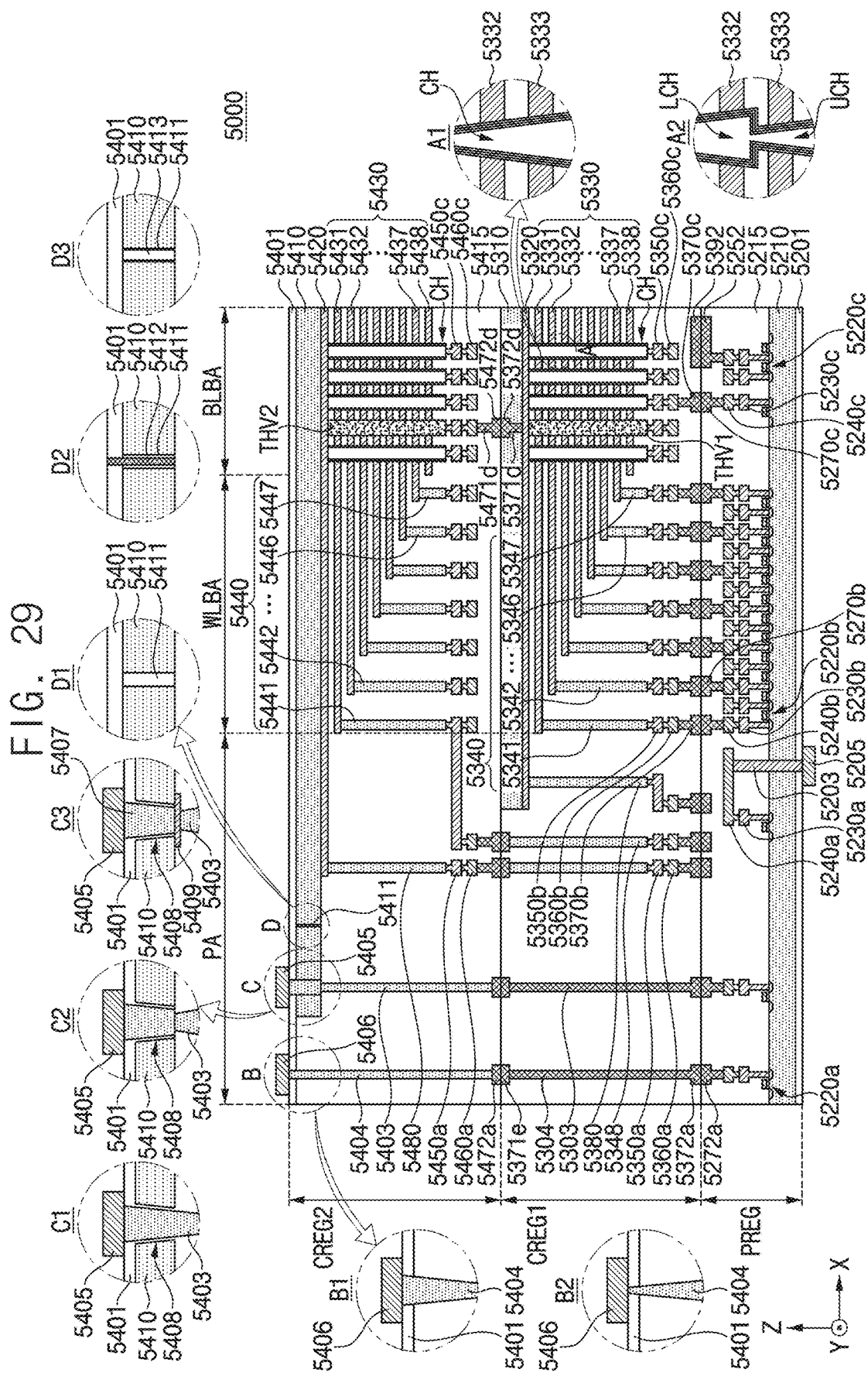
FIG. 29 is a cross-sectional view of a memory device according to example embodiments.

FIG. 29 is a cross-sectional view of a memory device according to example embodiments.

Referring to FIG. 29, a memory device (or nonvolatile memory device) 5000 may have a chip-to-chip (C2C) structure. At least one upper chip including a cell region and a lower chip including a peripheral circuit region PREG may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in example embodiments in which the bonding metal patterns are formed of copper (Cu), the bonding method may be a Cu—Cu bonding method. Alternatively, the bonding metal patterns may be formed of aluminum (Al) or tungsten (W).

The memory device 5000 may include the at least one upper chip including the cell region. For example, as illustrated in FIG. 29, the memory device 5000 may include two upper chips. However, the number of the upper chips is not limited thereto. In example embodiments in which the memory device 5000 includes the two upper chips, a first upper chip including a first cell region CREG1, a second upper chip including a second cell region CREG2 and the lower chip including the peripheral circuit region PREG may be manufactured separately, and then, the first upper chip, the second upper chip and the lower chip may be connected to each other by the bonding method to manufacture the memory device 5000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 29. However, example embodiments are not limited thereto. In some example embodiments, one of the first upper chip and the second upper chip may be turned over and then may be connected to a corresponding chip by the bonding method.

Each of the peripheral circuit region PREG and the first and second cell regions CREG1 and CREG2 of the memory device 5000 may include an external pad bonding region PA, a wordline bonding region WLBA, and a bitline bonding region BLBA.

The peripheral circuit region PREG may include a first substrate 5210 and a plurality of circuit elements 5220a, 5220b and 5220c formed on the first substrate 5210. An interlayer insulating layer 5215 including one or more insulating layers may be provided on the plurality of circuit elements 5220a, 5220b and 5220c, and a plurality of metal lines electrically connected to the plurality of circuit elements 5220a, 5220b and 5220c may be provided in the interlayer insulating layer 5215. For example, the plurality of metal lines may include first metal lines 5230a, 5230b and 5230c connected to the plurality of circuit elements 5220a, 5220b and 5220c, and second metal lines 5240a, 5240b and 5240c formed on the first metal lines 5230a, 5230b and 5230c. The plurality of metal lines may be formed of at least one of various conductive materials. For example, the first metal lines 5230a, 5230b and 5230c may be formed of tungsten having a relatively high electrical resistivity, and the second metal lines 5240a, 5240b and 5240c may be formed of copper having a relatively low electrical resistivity.

The first metal lines 5230a, 5230b and 5230c and the second metal lines 5240a, 5240b and 5240c are illustrated and described in some example embodiments. However, example embodiments are not limited thereto. In some example embodiments, at least one or more additional metal lines may further be formed on the second metal lines 5240a, 5240b and 5240c. In some example embodiments, the second metal lines 5240a, 5240b and 5240c may be formed of aluminum, and at least some of the additional metal lines formed on the second metal lines 5240a, 5240b and 5240c may be formed of copper having an electrical resistivity lower than that of aluminum of the second metal lines 5240a, 5240b and 5240c.

The interlayer insulating layer 5215 may be disposed on the first substrate 5210 and may include an insulating material such as silicon oxide and/or silicon nitride.

Each of the first and second cell regions CREG1 and CREG2 may include at least one memory block. The first cell region CREG1 may include a second substrate 5310 and a common source line 5320. A plurality of wordlines 5330 (5331 to 5338) may be stacked on the second substrate 5310 in a direction (e.g., the Z-axis direction) perpendicular to a top surface of the second substrate 5310. String selection lines and a ground selection line may be disposed on and under the wordlines 5330, and the plurality of wordlines 5330 may be disposed between the string selection lines and the ground selection line. Likewise, the second cell region CREG2 may include a third substrate 5410 and a common source line 5420, and a plurality of wordlines 5430 (5431 to 5438) may be stacked on the third substrate 5410 in a direction (e.g., the Z-axis direction) perpendicular to a top surface of the third substrate 5410. Each of the second substrate 5310 and the third substrate 5410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CREG1 and CREG2.

In some example embodiments, as illustrated in a region 'A1', the channel structure CH may be provided in the bitline bonding region BLBA and may extend in the direction perpendicular to the top surface of the second substrate 5310 to penetrate the wordlines 5330, the string selection lines, and the ground selection line. The channel structure CH may include a data storage layer, a channel layer, and a filling insulation layer. The channel layer may be electrically connected to a first metal line 5350c and a second metal line 5360c in the bitline bonding region BLBA. For example, the second metal line 5360c may be a bitline and may be connected to the channel structure CH through the first metal line 5350c. The bitline 5360c may extend in a first direction (e.g., a Y-axis direction) parallel to the top surface of the second substrate 5310.

In some example embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 5310 to penetrate the common source line 5320 and lower wordlines 5331 and 5332. The lower channel LCH may include a data storage layer, a channel layer, and a filling insulation layer and may be connected to the upper channel UCH. The upper channel UCH may penetrate upper wordlines 5333 to 5338. The upper channel UCH may include a data storage layer, a channel layer, and a filling insulation layer, and the channel layer of the upper channel UCH may be electrically connected to the first metal line 5350c and the second metal line 5360c. As a length of a channel increases, due to characteristics of manufacturing processes, it may be difficult to form a channel having a substantially uniform width. The memory device 5000 according to some example embodiments may include a channel having improved width uniformity due to the lower channel LCH and the upper channel UCH which are formed by the processes performed sequentially.

In example embodiments in which the channel structure CH includes the lower channel LCH and the upper channel UCH as illustrated in the region 'A2', a wordline located near to a boundary between the lower channel LCH and the upper channel UCH may be a dummy wordline. For example, the wordlines 5332 and 5333 adjacent to the boundary between the lower channel LCH and the upper channel UCH may be the dummy wordlines. In some example embodiments, data may not be stored in memory cells connected to the dummy wordline. Alternatively, the number of pages corresponding to the memory cells connected to the dummy wordline may be less than the number of pages corresponding to the memory cells connected to a general wordline. A level of a voltage applied to the dummy wordline may be different from a level of a voltage applied to the general wordline, and thus it is possible to reduce an influence of a non-uniform channel width between the lower and upper channels LCH and UCH on an operation of the memory device.

In some example embodiments, the number of the lower wordlines 5331 and 5332 penetrated by the lower channel LCH is less than the number of the upper wordlines 5333 to 5338 penetrated by the upper channel UCH in the region 'A2'. However, example embodiments are not limited thereto. In some example embodiments, the number of the lower wordlines penetrated by the lower channel LCH may be equal to or more than the number of the upper wordlines penetrated by the upper channel UCH. In addition, structural features and connection relation of the channel structure CH disposed in the second cell region CREG2 may be the same or substantially the same as those of the channel structure CH disposed in the first cell region CREG1.

In the bitline bonding region BLBA, a first through-electrode THV1 may be provided in the first cell region CREG1, and a second through-electrode THV2 may be provided in the second cell region CREG2. As illustrated in FIG. 29, the first through-electrode THV1 may penetrate the common source line 5320 and the plurality of wordlines 5330. In some example embodiments, the first through-electrode THV1 may further penetrate the second substrate 5310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some example embodiments, the first through-electrode THV1 and the second through-electrode THV2 may be electrically connected to each other through a first through-metal pattern 5372*d* and a second through-metal pattern 5472*d*. The first through-metal pattern 5372*d* may be formed at a bottom end of the first upper chip including the first cell region CREG1, and the second through-metal pattern 5472*d* may be formed at a top end of the second upper chip including the second cell region CREG2. The first through-electrode THV1 may be electrically connected to the first metal line 5350*c* and the second metal line 5360*c*. A lower via 5371*d* may be formed between the first through-electrode THV1 and the first through-metal pattern 5372*d*, and an upper via 5471*d* may be formed between the second through-electrode THV2 and the second through-metal pattern 5472*d*. The first through-metal pattern 5372*d* and the second through-metal pattern 5472*d* may be connected to each other by the bonding method.

In addition, in the bitline bonding region BLBA, an upper metal pattern 5252 may be formed in an uppermost metal layer of the peripheral circuit region PERI, and an upper metal pattern 5392 having the same shape as the upper metal pattern 5252 may be formed in an uppermost metal layer of the first cell region CREG1. The upper metal pattern 5392 of the first cell region CREG1 and the upper metal pattern 5252 of the peripheral circuit region PREG may be electrically connected to each other by the bonding method. In the bitline bonding region BLBA, the bitline 5360*c* may be electrically connected to a page buffer included in the peripheral circuit region PERI. For example, some of the circuit elements 5220*c* of the peripheral circuit region PREG may constitute the page buffer, and the bitline 5360*c* may be electrically connected to the circuit elements 5220*c* constituting the page buffer through an upper bonding metal pattern 5370*c* of the first cell region CREG1 and an upper bonding metal pattern 5270*c* of the peripheral circuit region PERI.

Referring continuously to FIG. 29, in the wordline bonding region WLBA, the wordlines 5330 of the first cell region CREG1 may extend in a second direction (e.g., an X-axis direction) parallel to the top surface of the second substrate 5310 and may be connected to a plurality of cell contact plugs 5340 (5341 to 5347). First metal lines 5350*b* and second metal lines 5360*b* may be sequentially connected onto the cell contact plugs 5340 connected to the wordlines 5330. In the wordline bonding region WLBA, the cell contact plugs 5340 may be connected to the peripheral circuit region PREG through upper bonding metal patterns 5370*b* of the first cell region CREG1 and upper bonding metal patterns 5270*b* of the peripheral circuit region PERI.

The cell contact plugs 5340 may be electrically connected to a row decoder included in the peripheral circuit region PERI. For example, some of the circuit elements 5220*b* of the peripheral circuit region PREG may constitute the row decoder, and the cell contact plugs 5340 may be electrically connected to the circuit elements 5220*b* constituting the row decoder through the upper bonding metal patterns 5370*b* of the first cell region CREG1 and the upper bonding metal patterns 5270*b* of the peripheral circuit region PERI. In some example embodiments, an operating voltage of the circuit elements 5220*b* constituting the row decoder may be different from an operating voltage of the circuit elements 5220*c* constituting the page buffer. For example, the operating voltage of the circuit elements 5220*c* constituting the page buffer may be greater than the operating voltage of the circuit elements 5220*b* constituting the row decoder.

Likewise, in the wordline bonding region WLBA, the wordlines 5430 of the second cell region CREG2 may extend in the second direction (e.g., the X-axis direction) parallel to the top surface of the third substrate 5410 and may be connected to a plurality of cell contact plugs 5440 (5441 to 5447). The cell contact plugs 5440 may be connected to the peripheral circuit region PREG through an upper metal pattern of the second cell region CREG2 and lower and upper metal patterns and a cell contact plug 5348 of the first cell region CREG1.

In the wordline bonding region WLBA, the upper bonding metal patterns 5370*b* may be formed in the first cell region CREG1, and the upper bonding metal patterns 5270*b* may be formed in the peripheral circuit region PERI. The upper bonding metal patterns 5370*b* of the first cell region CREG1 and the upper bonding metal patterns 5270*b* of the peripheral circuit region PREG may be electrically connected to each other by the bonding method. The upper bonding metal patterns 5370*b* and the upper bonding metal patterns 5270*b* may be formed of aluminum, copper, or tungsten.

In the external pad bonding region PA, a lower metal pattern 5371*e* may be formed in a lower portion of the first cell region CREG1, and an upper metal pattern 5472*a* may be formed in an upper portion of the second cell region CREG2. The lower metal pattern 5371*e* of the first cell region CREG1 and the upper metal pattern 5472a of the second cell region CREG2 may be connected to each other by the bonding method in the external pad bonding region PA. Likewise, an upper metal pattern 5372a may be formed in an upper portion of the first cell region CREG1, and an upper metal pattern 5272a may be formed in an upper portion of the peripheral circuit region PERI. The upper metal pattern 5372a of the first cell region CREG1 and the upper metal pattern 5272a of the peripheral circuit region PREG may be connected to each other by the bonding method.

Common source line contact plugs 5380 and 5480 may be disposed in the external pad bonding region PA. The common source line contact plugs 5380 and 5480 may be formed of a conductive material such as a metal, a metal compound, and/or doped polysilicon. The common source line contact plug 5380 of the first cell region CREG1 may be electrically connected to the common source line 5320, and the common source line contact plug 5480 of the second cell region CREG2 may be electrically connected to the common source line 5420. A first metal line 5350a and a second metal line 5360a may be sequentially stacked on the common source line contact plug 5380 of the first cell region CREG1, and a first metal line 5450a and a second metal line 5460a may be sequentially stacked on the common source line contact plug 5480 of the second cell region CREG2.

Input/output pads 5205, 5405 and 5406 may be disposed in the external pad bonding region PA. Referring to FIG. 29, a lower insulating layer 5201 may cover a bottom surface of the first substrate 5210, and a first input/output pad 5205 may be formed on the lower insulating layer 5201. The first input/output pad 5205 may be connected to at least one of a plurality of the circuit elements 5220a disposed in the peripheral circuit region PREG through a first input/output contact plug 5203 and may be separated from the first substrate 5210 by the lower insulating layer 5201. In addition, a side insulating layer may be disposed between the first input/output contact plug 5203 and the first substrate 5210 to electrically isolate the first input/output contact plug 5203 from the first substrate 5210.

An upper insulating layer 5401 covering a top surface of the third substrate 5410 may be formed on the third substrate 5410. A second input/output pad 5405 and/or a third input/output pad 5406 may be disposed on the upper insulating layer 5401. The second input/output pad 5405 may be connected to at least one of the plurality of circuit elements 5220a disposed in the peripheral circuit region PREG through second input/output contact plugs 5403 and 5303, and the third input/output pad 5406 may be connected to at least one of the plurality of circuit elements 5220a disposed in the peripheral circuit region PREG through third input/output contact plugs 5404 and 5304.

In some example embodiments, the third substrate 5410 may not be disposed in a region in which the input/output contact plug is disposed. For example, as illustrated in a region 'B', the third input/output contact plug 5404 may be separated from the third substrate 5410 in a direction parallel to the top surface of the third substrate 5410 and may penetrate an interlayer insulating layer 5415 of the second cell region CREG2 so as to be connected to the third input/output pad 5406. In some example embodiments, the third input/output contact plug 5404 may be formed by at least one of various processes.

In some example embodiments, as illustrated in a region 'B1', the third input/output contact plug 5404 may extend in a third direction (e.g., the Z-axis direction), and a diameter of the third input/output contact plug 5404 may become progressively greater toward the upper insulating layer 5401. In other words, a diameter of the channel structure CH described in the region 'A1' may become progressively less toward the upper insulating layer 5401, but the diameter of the third input/output contact plug 5404 may become progressively greater toward the upper insulating layer 5401. For example, the third input/output contact plug 5404 may be formed after the second cell region CREG2 and the first cell region CREG1 are bonded to each other by the bonding method.

In some example embodiments, as illustrated in a region 'B2', the third input/output contact plug 5404 may extend in the third direction (e.g., the Z-axis direction), and a diameter of the third input/output contact plug 5404 may become progressively less toward the upper insulating layer 5401. In other words, like the channel structure CH, the diameter of the third input/output contact plug 5404 may become progressively less toward the upper insulating layer 5401. For example, the third input/output contact plug 5404 may be formed together with the cell contact plugs 5440 before the second cell region CREG2 and the first cell region CREG1 are bonded to each other.

In some example embodiments, the input/output contact plug may overlap with the third substrate 5410. For example, as illustrated in a region 'C', the second input/output contact plug 5403 may penetrate the interlayer insulating layer 5415 of the second cell region CREG2 in the third direction (e.g., the Z-axis direction) and may be electrically connected to the second input/output pad 5405 through the third substrate 5410. In some example embodiments, a connection structure of the second input/output contact plug 5403 and the second input/output pad 5405 may be realized by various methods.

In some example embodiments, as illustrated in a region 'C1', an opening 5408 may be formed to penetrate the third substrate 5410, and the second input/output contact plug 5403 may be connected directly to the second input/output pad 5405 through the opening 5408 formed in the third substrate 5410. In some example embodiments, as illustrated in the region 'C1', a diameter of the second input/output contact plug 5403 may become progressively greater toward the second input/output pad 5405. However, example embodiments are not limited thereto, and in some example embodiments, the diameter of the second input/output contact plug 5403 may become progressively less toward the second input/output pad 5405.

In some example embodiments, as illustrated in a region 'C2', the opening 5408 penetrating the third substrate 5410 may be formed, and a contact 5407 may be formed in the opening 5408. An end of the contact 5407 may be connected to the second input/output pad 5405, and another end of the contact 5407 may be connected to the second input/output contact plug 5403. Thus, the second input/output contact plug 5403 may be electrically connected to the second input/output pad 5405 through the contact 5407 in the opening 5408. In some example embodiments, as illustrated in the region 'C2', a diameter of the contact 5407 may become progressively greater toward the second input/output pad 5405, and a diameter of the second input/output contact plug 5403 may become progressively less toward the second input/output pad 5405. For example, the second input/output contact plug 5403 may be formed together with the cell contact plugs 5440 before the second cell region CREG2 and the first cell region CREG1 are bonded to each other, and the contact 5407 may be formed after the second cell region CREG2 and the first cell region CREG1 are bonded to each other.

In some example embodiments illustrated in a region 'C3', a stopper 5409 may further be formed on a bottom end of the opening 5408 of the third substrate 5410, as compared with the example embodiments of the region 'C2'. The stopper 5409 may be a metal line formed in the same layer as the common source line 5420. Alternatively, the stopper 5409 may be a metal line formed in the same layer as at least one of the wordlines 5430. The second input/output contact plug 5403 may be electrically connected to the second input/output pad 5405 through the contact 5407 and the stopper 5409.

Like the second and third input/output contact plugs 5403 and 5404 of the second cell region CREG2, a diameter of each of the second and third input/output contact plugs 5303 and 5304 of the first cell region CREG1 may become progressively less toward the lower metal pattern 5371*e* or may become progressively greater toward the lower metal pattern 5371*e*.

In some example embodiments, a slit 5411 may be formed in the third substrate 5410. For example, the slit 5411 may be formed at a certain position of the external pad bonding region PA. For example, as illustrated in a region 'D', the slit 5411 may be located between the second input/output pad 5405 and the cell contact plugs 5440 when viewed in a plan view. Alternatively, the second input/output pad 5405 may be located between the slit 5411 and the cell contact plugs 5440 when viewed in a plan view.

In some example embodiments, as illustrated in a region 'D1', the slit 5411 may be formed to penetrate the third substrate 5410. For example, the slit 5411 may be used to reduce or prevent the third substrate 5410 from being finely cracked when the opening 5408 is formed. However, example embodiments are not limited thereto, and in some example embodiments, the slit 5411 may be formed to have a depth ranging from about 60% to about 70% of a thickness of the third substrate 5410.

In some example embodiments, as illustrated in a region 'D2', a conductive material 5412 may be formed in the slit 5411. For example, the conductive material 5412 may be used to discharge a leakage current occurring in driving of the circuit elements in the external pad bonding region PA to the outside. In some example embodiments, the conductive material 5412 may be connected to an external ground line.

In some example embodiments, as illustrated in a region 'D3', an insulating material 5413 may be formed in the slit 5411. For example, the insulating material 5413 may be used to electrically isolate the second input/output pad 5405 and the second input/output contact plug 5403 disposed in the external pad bonding region PA from the wordline bonding region WLBA. Since the insulating material 5413 is formed in the slit 5411, it is possible to reduce or prevent a voltage provided through the second input/output pad 5405 from affecting a metal layer disposed on the third substrate 5410 in the wordline bonding region WLBA.

In some example embodiments, the first to third input/output pads 5205, 5405 and 5406 may be selectively formed. For example, the memory device 5000 may be realized to include only the first input/output pad 5205 disposed on the first substrate 5210, to include only the second input/output pad 5405 disposed on the third substrate 5410, or to include only the third input/output pad 5406 disposed on the upper insulating layer 5401.

In some example embodiments, at least one of the second substrate 5310 of the first cell region CREG1 or the third substrate 5410 of the second cell region CREG2 may be used as a sacrificial substrate and may be completely or partially removed before or after a bonding process. An additional layer may be stacked after the removal of the substrate. For example, the second substrate 5310 of the first cell region CREG1 may be removed before or after the bonding process of the peripheral circuit region PREG and the first cell region CREG1, and then, an insulating layer covering a top surface of the common source line 5320 or a conductive layer for connection may be formed. Likewise, the third substrate 5410 of the second cell region CREG2 may be removed before or after the bonding process of the first cell region CREG1 and the second cell region CREG2, and then, the upper insulating layer 5401 covering a top surface of the common source line 5420 or a conductive layer for connection may be formed.

The example embodiments may be applied to various electronic devices and systems that include the memory devices. For example, the example embodiments may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IOT) device, an internet of everything (IoE) device, an e-book reader, a virtual reality (VR) device, an augmented reality (AR) device, a robotic device, a drone, an automotive, etc.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a memory device including a memory block connected to a plurality of wordlines, the method comprising:
    performing a first operation on the memory block by applying first driving voltages to the plurality of wordlines;
    after the first operation is completed, performing a first recovery operation in which the first driving voltages applied to the plurality of wordlines are discharged; and
    after the first recovery operation is completed, performing a second operation on the memory block by applying second driving voltages to the plurality of wordlines, wherein, in the first recovery operation, first charges among a plurality of charges stored by the first driving voltages are stored in a charge recycling memory block connected to at least one charge recycling wordline, and wherein, in the second operation, the second driving voltages are applied to the plurality of wordlines using the first charges stored in the charge recycling memory block.

2. The method of claim 1, wherein an operation of storing the first charges in the charge recycling memory block and an operation of applying the second driving voltages using the first charges are performed based on a charge sharing operation.

3. The method of claim 2, wherein the operation of storing the first charges in the charge recycling memory block and the operation of applying the second driving voltages using the first charges are performed using capacitances of charge recycling memory cells included in the charge recycling memory block and a capacitance of the at least one charge recycling wordline.

4. The method of claim 3,
wherein the charge recycling memory block and the charge recycling memory cells are a dummy memory block and dummy memory cells in which data is not stored, and
wherein the at least one charge recycling wordline is a dummy wordline.

5. The method of claim 1,
wherein the first operation is a first read operation performed on a first page that is included in the memory block and connected to a first wordline among the plurality of wordlines, and
wherein the second operation is a second read operation performed on a second page that is included in the memory block and connected to a second wordline different from the first wordline among the plurality of wordlines.

6. The method of claim 5, wherein the performing the first operation includes:
applying a read voltage to the first wordline; and
applying a read inhibit voltage to wordlines other than the first wordline among the plurality of wordlines.

7. The method of claim 5, wherein the performing the first recovery operation includes:
electrically connecting the plurality of wordlines with the at least one charge recycling wordline; and
performing a first discharging operation in which voltage levels of the plurality of wordlines decrease, and
wherein the first charges move to the charge recycling memory block through the at least one charge recycling wordline by a charge sharing operation.

8. The method of claim 7, wherein the performing the first recovery operation further includes:
electrically disconnecting the plurality of wordlines from the at least one charge recycling wordline; and
performing a second discharging operation in which the voltage levels of the plurality of wordlines additionally decrease.

9. The method of claim 5, wherein the performing the second operation includes:
electrically connecting the plurality of wordlines with the at least one charge recycling wordline; and
performing a first charging operation in which voltage levels of the plurality of wordlines increase, and
wherein the first charges move to the plurality of wordlines through the at least one charge recycling wordline by a charge sharing operation.

10. The method of claim 9, wherein the performing the second operation further includes:
electrically disconnecting the plurality of wordlines from the at least one charge recycling wordline;
electrically connecting a charge pump with the at least one charge recycling wordline; and
performing a second charging operation in which the voltage levels of the plurality of wordlines additionally increase using the charge pump.

11. The method of claim 1,
wherein the first operation is a first program operation performed on a first page that is included in the memory block and connected to a first wordline among the plurality of wordlines, and
wherein the second operation is a first program verification operation performed on the first page.

12. The method of claim 11, wherein the performing the first operation includes:
applying a program voltage to the first wordline; and
applying a program inhibit voltage to wordlines other than the first wordline among the plurality of wordlines.

13. The method of claim 11, wherein the performing the first recovery operation includes:
electrically connecting the wordlines other than the first wordline among the plurality of wordlines with the at least one charge recycling wordline; and
performing a first discharging operation in which voltage levels of all of the plurality of wordlines decrease, and
wherein the first charges move to the charge recycling memory block through the at least one charge recycling wordline by a charge sharing operation.

14. The method of claim 11, wherein the performing the first recovery operation includes:
electrically connecting all of the plurality of wordlines with the at least one charge recycling wordline; and
performing a first discharging operation in which voltage levels of all of the plurality of wordlines decrease, and
wherein the first charges move to the charge recycling memory block through the at least one charge recycling wordline by a charge sharing operation.

15. The method of claim 1,
wherein the first operation is a first program operation performed on a first page that is included in the memory block and connected to a first wordline among the plurality of wordlines, and
wherein the second operation is a second program operation performed on the first page.

16. The method of claim 1, wherein the memory block is a vertical memory block including a plurality of memory cells that are arranged in a vertical direction on a substrate.

17. A memory device comprising:
a memory cell array including a memory block connected to a plurality of wordlines, and a charge recycling memory block connected to at least one charge recycling wordline;
a voltage generator configured to generate a plurality of driving voltages applied to the plurality of wordlines; and
a control circuit configured to control an operation of the memory cell array and an operation of the voltage generator,
wherein the control circuit is configured to:

perform a first operation on the memory block by applying first driving voltages to the plurality of wordlines;

after the first operation is completed, perform a first recovery operation in which the first driving voltages applied to the plurality of wordlines are discharged; and after the first recovery operation is completed, perform a second operation on the memory block by applying second driving voltages to the plurality of wordlines, wherein, in the first recovery operation, first charges among a plurality of charges stored by the first driving voltages are stored in the charge recycling memory block, and wherein, in the second operation, the second driving voltages are applied to the plurality of wordlines using the first charges stored in the charge recycling memory block.

18. The memory device of claim 17,
wherein the control circuit includes:
 a charge recycling control circuit configured to control an operation of the at least one charge recycling wordline and an operation of the charge recycling memory block, and
wherein the charge recycling control circuit includes:
 a first transistor configured to electrically connect the at least one charge recycling wordline with the plurality of wordlines based on a first control signal; and
 a control signal generator configured to generate the first control signal.

19. The memory device of claim 18,
wherein the voltage generator includes:
 a charge pump used to generate the first driving voltages and the second driving voltages,
wherein the charge recycling control circuit further includes:
 a second transistor configured to electrically connect the at least one charge recycling wordline with the charge pump based on a second control signal, and
wherein the control signal generator is configured to further generate the second control signal.

20. A method of operating a memory device including a memory block connected to a plurality of wordlines, the method comprising:
 performing a first operation on the memory block by applying first driving voltages to the plurality of wordlines;
 after the first operation is completed, performing a first recovery operation in which the first driving voltages applied to the plurality of wordlines are discharged; and
 after the first recovery operation is completed, performing a second operation on the memory block by applying second driving voltages to the plurality of wordlines,
wherein performing the first recovery operation includes:
 electrically connecting the plurality of wordlines with the at least one charge recycling wordline;
 performing a first discharging operation in which voltage levels of the plurality of wordlines decrease, the first discharging operation being performed by storing first charges among a plurality of charges stored by the first driving voltages in a charge recycling memory block connected to the at least one charge recycling wordline;
 electrically disconnecting the plurality of wordlines from the at least one charge recycling wordline; and
 performing a second discharging operation in which the voltage levels of the plurality of wordlines additionally decrease,
wherein performing the second operation includes:
 electrically connecting the plurality of wordlines with the at least one charge recycling wordline;
 performing a first charging operation in which the voltage levels of the plurality of wordlines increase, the first charging operation being performed by applying the second driving voltages to the plurality of wordlines using the first charges stored in the charge recycling memory block;
 electrically disconnecting the plurality of wordlines from the at least one charge recycling wordline;
 electrically connecting a charge pump with the at least one charge recycling wordline; and
 performing a second charging operation in which the voltage levels of the plurality of wordlines additionally increase using the charge pump,
wherein, in the first discharging operation, the first charges move to the charge recycling memory block through the at least one charge recycling wordline by a charge sharing operation, and
wherein, in the first charging operation, the first charges move to the plurality of wordlines through the at least one charge recycling wordline by the charge sharing operation.

* * * * *